United States Patent
Wang

(10) Patent No.: US 12,142,224 B2
(45) Date of Patent: Nov. 12, 2024

(54) SHIFT REGISTER AND DRIVING METHOD THEREOF, SCAN DRIVING CIRCUIT, DISPLAY PANEL AND DISPLAY APPARATUS

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Zhu Wang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 18/044,725

(22) PCT Filed: Mar. 23, 2022

(86) PCT No.: PCT/CN2022/082613
§ 371 (c)(1),
(2) Date: Mar. 9, 2023

(87) PCT Pub. No.: WO2023/178575
PCT Pub. Date: Sep. 28, 2023

(65) Prior Publication Data
US 2024/0194145 A1 Jun. 13, 2024

(51) Int. Cl.
*G09G 3/3266* (2016.01)
*G09G 3/32* (2016.01)
*G11C 19/28* (2006.01)

(52) U.S. Cl.
CPC .......... *G09G 3/3266* (2013.01); *G09G 3/32* (2013.01); *G09G 2310/0267* (2013.01); *G09G 2310/0286* (2013.01); *G09G 2310/08* (2013.01); *G11C 19/28* (2013.01)

(58) Field of Classification Search
CPC .......... G09G 3/3266; G09G 3/32; G09G 2310/0267; G09G 2310/0286; G09G 2310/08; G11C 19/28
See application file for complete search history.

(56) References Cited

U.S. PATENT DOCUMENTS

| | | | |
|---|---|---|---|
| 9,626,933 B2 * | 4/2017 | Zheng | G11C 19/28 |
| 2017/0278450 A1 * | 9/2017 | Ma | G09G 3/3677 |
| 2024/0087661 A1 * | 3/2024 | Yuan | G11C 19/28 |

* cited by examiner

*Primary Examiner* — Mihir K Rayan
(74) *Attorney, Agent, or Firm* — IP & T GROUP LLP

(57) ABSTRACT

A shift register includes an input circuit, a first output circuit, a first control circuit, a second control circuit and a second output circuit. The input circuit is configured to transmit an input signal provided by an input signal terminal to a first node. The first output circuit is configured to transmit a first output signal provided by a first output signal terminal to a scan signal terminal. The first control circuit is configured to transmit a third output signal provided by a third output signal terminal to a second node. The second control circuit is configured to control a potential at the first node and a potential at the second node to be two inverted potentials. The second output circuit is configured to transmit a second output signal provided by a second output signal terminal to the scan signal terminal.

20 Claims, 11 Drawing Sheets

SHIFT REGISTER AND DRIVING METHOD THEREOF, SCAN DRIVING CIRCUIT, DISPLAY PANEL AND DISPLAY APPARATUS

CROSS-REFERENCE TO RELATED APPLICATION

This application is a national phase entry under 35 USC 371 of International Patent Application No. PCT/CN2022/082613, filed on Mar. 23, 2022, which is incorporated herein by reference in its entirety.

TECHNICAL FIELD

The present disclosure relates to the field of display technologies, and in particular, to a shift register and a driving method thereof, a scan driving circuit, a display panel and a display apparatus.

BACKGROUND

With the development of science and technology, the display technology is constantly progressing. By setting a scan driving circuit adopted in a display apparatus as a gate on array (GOA) circuit rather than a scan driving integrated circuit (IC), it may be possible to not only reduce costs for a manufacturing the display apparatus, but also reduce a bezel width of the display apparatus. Therefore, setting the scan driving circuit as the GOA circuit is widely used in the display field.

SUMMARY

In an aspect, a shift register is provided. The shift register includes an input circuit, a first output circuit, a first control circuit, a second control circuit and a second output circuit. The input circuit is coupled to an input signal terminal, a first clock signal terminal and a first node. The input circuit is configured to transmit an input signal provided by the input signal terminal to the first node under control of a first clock signal provided by the first clock signal terminal. The first output circuit is coupled to the first node, a first output signal terminal and a scan signal terminal. The first output circuit is configured to transmit a first output signal provided by the first output signal terminal to the scan signal terminal under control of a potential at the first node. The first control circuit is at least coupled to the input signal terminal, a first voltage signal terminal, the first clock signal terminal, a second voltage signal terminal, a second clock signal terminal, a third output signal terminal and a second node. The first control circuit is configured to transmit a third output signal provided by the third output signal terminal to the second node at least under control of the input signal provided by the input signal terminal, a second clock signal provided by the second clock signal terminal, and the first clock signal provided by the first clock signal terminal. The second control circuit is coupled to the first node and the second node. The second control circuit is configured to control the potential at the first node and a potential at the second node to be two inverted potentials. The second output circuit is coupled to the second node, a second output signal terminal and the scan signal terminal. The second output circuit is configured to transmit a second output signal provided by the second output signal terminal to the scan signal terminal under control of the potential at the second node.

In some embodiments, the first control circuit is further coupled to a fourth output signal terminal and a control signal terminal. The first control circuit is configured to transmit the third output signal provided by the third output signal terminal to the second node under control of the input signal provided by the input signal terminal, the second clock signal provided by the second clock signal terminal, a control signal provided by the control signal terminal and the first clock signal provided by the first clock signal terminal.

The first control circuit includes a first node control sub-circuit, a second node control sub-circuit, a third node control sub-circuit, and a fourth node control sub-circuit. The first node control sub-circuit is coupled to the input signal terminal, the first voltage signal terminal and a third node. The first node control sub-circuit is configured to transmit a first voltage signal provided by the first voltage signal terminal to the third node under control of the input signal provided by the input signal terminal. The second node control sub-circuit is coupled to the second clock signal terminal and the third node. The second node control sub-circuit is configured to raise or lower a potential at the third node under control of the second clock signal provided by the second clock signal terminal. The third node control sub-circuit is coupled to the second voltage signal terminal, the control signal terminal, the fourth output signal terminal, the first clock signal terminal, the third node and a fourth node. The third node control sub-circuit is configured to raise or lower a potential at the fourth node under control of the potential at the third node, the first clock signal provided by the first clock signal terminal and the control signal provided by the control signal terminal. The fourth node control sub-circuit is coupled to the fourth node, the third output signal terminal and the second node. The fourth node control sub-circuit is configured to transmit the third output signal provided by the third output signal terminal to the second node under control of a potential at the fourth node.

In some embodiments, the third node control sub-circuit includes a first node control module, a second node control module and a third node control module. The first node control module is coupled to the third node, the second voltage signal terminal and the fourth node. The first node control module is configured to transmit a second voltage signal provided by the second voltage signal terminal to the fourth node under control of the potential at the third node. The second node control module is coupled to the fourth node and the control signal terminal. The second node control module is configured to raise or lower the potential at the fourth node under control of the control signal provided by the control signal terminal. The third node control module is coupled to the fourth node, the first clock signal terminal and the fourth output signal terminal. The third node control module is configured to transmit a fourth output signal provided by the fourth output signal terminal to the fourth node under the control of the first clock signal provided by the first clock signal terminal.

In some embodiments, the second node control module includes a second capacitor. The control signal terminal includes the input signal terminal; a first electrode plate of the second capacitor is coupled to the control signal terminal, and a second electrode plate of the second capacitor is coupled to the fourth node. Alternatively, the control signal terminal includes the second clock signal terminal; the first electrode plate of the second capacitor is coupled to the second clock signal terminal, and the second electrode plate of the second capacitor is coupled to the fourth node.

In some embodiments, the first node control module includes a third transistor; a control electrode of the third transistor is coupled to the third node, a first electrode of the third transistor is coupled to the second voltage signal terminal, and a second electrode of the third transistor is coupled to the fourth node.

In some embodiments, the third node control module includes a fourth transistor. The fourth output signal terminal includes the first voltage signal terminal; a control electrode of the fourth transistor is coupled to the first clock signal terminal, a first electrode of the fourth transistor is coupled to the first voltage signal terminal, and a second electrode of the fourth transistor is coupled to the fourth node. Alternatively, the fourth output signal terminal includes the second clock signal terminal; the control electrode of the fourth transistor is coupled to the first clock signal terminal, the first electrode of the fourth transistor is coupled to the second clock signal terminal, and the second electrode of the fourth transistor is coupled to the fourth node.

In some embodiments, the third node control sub-circuit further includes a fourth node control module. The fourth node control module is coupled to the second clock signal terminal, the third node and the fourth node. The fourth node control module is configured to transmit the second clock signal provided by the second clock signal terminal to the fourth node under the control of the potential at the third node.

In some embodiments, the fourth node control module includes a second transistor. A control electrode of the second transistor is coupled to the third node, a first electrode of the second transistor is coupled to the second clock signal terminal, and a second electrode of the second transistor is coupled to the fourth node.

In some embodiments, the first node control sub-circuit includes a first transistor. A control electrode of the first transistor is coupled to the input signal terminal, a first electrode of the first transistor is coupled to the first voltage signal terminal, and a second electrode of the first transistor is coupled to the third node. The second node control sub-circuit includes a first capacitor. A first electrode plate of the first capacitor is coupled to the second clock signal terminal, and a second electrode plate of the first capacitor is coupled to the third node.

In some embodiments, the fourth node control sub-circuit includes a fifth transistor. The third output signal terminal includes the second voltage signal terminal; a control electrode of the fifth transistor is coupled to the fourth node, a first electrode of the fifth transistor is coupled to the second voltage signal terminal, and a second electrode of the fifth transistor is coupled to the second node. Alternatively, the third output signal terminal includes the second clock signal terminal; the control electrode of the fifth transistor is coupled to the fourth node, the first electrode of the fifth transistor is coupled to the second clock signal terminal, and the second electrode of the fifth transistor is coupled to the second node.

In some embodiments, the second control circuit includes a sixth transistor. A control electrode of the sixth transistor is coupled to the first node, a first electrode of the sixth transistor is coupled to the first voltage signal terminal, and a second electrode of the sixth transistor is coupled to the second node.

In some embodiments, the input circuit includes a seventh transistor. A control electrode of the seventh transistor is coupled to the first clock signal terminal, a first electrode of the seventh transistor is coupled to the input signal terminal, and a second electrode of the seventh transistor is coupled to the first node.

In some embodiments, the input circuit includes an input sub-circuit and a voltage stabilizing sub-circuit. The input sub-circuit is coupled to the input signal terminal, the first clock signal terminal and a fifth node. The input sub-circuit is configured to transmit the input signal provided by the input signal terminal to the fifth node under the control of the first clock signal provided by the first clock signal terminal. The voltage stabilizing sub-circuit is coupled to the first node, the fifth node and the second voltage signal terminal. The voltage stabilizing sub-circuit is configured to form a path between the first node and the fifth node under control of a second voltage signal provided by the second voltage signal terminal.

In some embodiments, the input sub-circuit includes a seventh transistor, and the voltage stabilizing sub-circuit includes an eighth transistor. A control electrode of the seventh transistor is coupled to the first clock signal terminal, a first electrode of the seventh transistor is coupled to the input signal terminal, and a second electrode of the seventh transistor is coupled to the fifth node. A control electrode of the eighth transistor is coupled to the second voltage signal terminal, a first electrode of the eighth transistor is coupled to the fifth node, and a second electrode of the eighth transistor is coupled to the first node.

In some embodiments, the first output circuit includes a third capacitor and a ninth transistor. A first electrode plate of the third capacitor being coupled to the scan signal terminal, and a second electrode plate of the third capacitor being coupled to the first node. A control electrode of the ninth transistor being coupled to the first node, a first electrode of the ninth transistor being coupled to the first output signal terminal, and a second electrode of the ninth transistor being coupled to the scan signal terminal.

In some embodiments, the second output circuit includes a fourth capacitor and a tenth transistor. A first electrode plate of the fourth capacitor being coupled to the second output signal terminal, and a second electrode plate of the fourth capacitor being coupled to the second node. A control electrode of the tenth transistor being coupled to the second node, a first electrode of the tenth transistor being coupled to the second output signal terminal, and a second electrode of the tenth transistor being coupled to the scan signal terminal.

In some embodiments, a duration of an effective potential of the input signal is equal to a duration of an effective potential of a scan signal output by the scan signal terminal.

In another aspect, a driving method of a shift register is provided. The shift register includes an input circuit, a first output circuit, a first control circuit, a second control circuit and a second output circuit. The input circuit is coupled to an input signal terminal, a first clock signal terminal and a first node. The input circuit is configured to transmit an input signal provided by the input signal terminal to the first node under control of a first clock signal provided by the first clock signal terminal. The first output circuit is coupled to the first node, a first output signal terminal and a scan signal terminal. The first output circuit is configured to transmit a first output signal provided by the first output signal terminal to the scan signal terminal under control of a potential at the first node. The first control circuit is at least coupled to the input signal terminal, a first voltage signal terminal, the first clock signal terminal, a second voltage signal terminal, a second clock signal terminal, a third output signal terminal and a second node. The first control circuit is configured to transmit a third output signal provided by the third output signal terminal to the second node at least under control of the input signal provided by the input signal terminal, a second clock signal provided by the second clock signal terminal, and the first clock signal provided by the first clock signal terminal. The second control circuit is coupled to the first node and the second node. The second control circuit is configured to control the potential at the first node and a potential at the second node to be two inverted potentials. The second output circuit is coupled to the second node, a second output signal terminal and the scan signal terminal. The second output circuit is configured to transmit a second output signal provided by the second output signal terminal to the scan signal terminal under control of the potential at the second node.

A preset duration includes an input phase, an output phase and a reset phase. The driving method includes: in the input phase, controlling both the first output circuit and the second output circuit to be turned off, the scan signal terminal continuously outputting the first output signal; in the output phase, transmitting, by the first control circuit, the third output signal provided by the third output signal terminal to the second node, so as to control the second output circuit to continuously output the second output signal through the scan signal terminal, wherein a duration of the output phase is equal to a duration of an effective potential of the input signal; and in the reset phase, transmitting, by the input circuit, the input signal to the first node, so as to control the first output circuit to output the first output signal through the scan signal terminal.

In some embodiments, the first control circuit is further coupled to a control signal terminal; the output phase includes at least one first output sub-phase, at least one second output sub-phase and a third output sub-phase. Transmitting the third output signal provided by the third output signal terminal to the second node, so as to control the second output circuit to continuously output the second output signal through the scan signal terminal includes following steps. In a first output sub-circuit in the at least one first output sub-phase, the first control circuit transmits the third output signal provided by the third output signal terminal to the second node under control of the second clock signal provided by the second clock signal terminal, so as to control the second output circuit to output the second output signal through the scan signal terminal. In a second output sub-phase in the at least one second output sub-phase, the first control circuit is controlled to be turned off, and the scan signal terminal remains the second output signal output in the first output sub-phase. In the third output sub-phase, the first control circuit transmits the third output signal provided by the third output signal terminal to the second node under control of a control signal provided by the control signal terminal, so as to control the second output circuit to output the second output signal through the scan signal terminal.

In some embodiments, a number of the at least one first output sub-phase and a number of the at least one second output sub-phase each are one or more, and the number of the at least one first output sub-phase and the number of the at least one second output sub-phase are equal.

In yet another aspect, a scan driving circuit is provided. The scan driving circuit includes N shift registers that are cascaded each as described above.

In yet another aspect, a display panel is provided. The display panel has an active area and includes a plurality of sub-pixels located in the active area, the scan driving circuit as described above and a pulse width adjustment module. The plurality of sub-pixels are arranged in a plurality of rows and a plurality of columns. The pulse width adjustment module is coupled to the scan driving circuit, and a scan signal terminal of the scan driving circuit is coupled to sub-pixels located in a same row.

In yet another aspect, a display apparatus is provided. The display apparatus includes the display panel as described above.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method and an actual timing of a signal to which the embodiments of the present disclosure relate.

DETAILED DESCRIPTION

Figure 1:
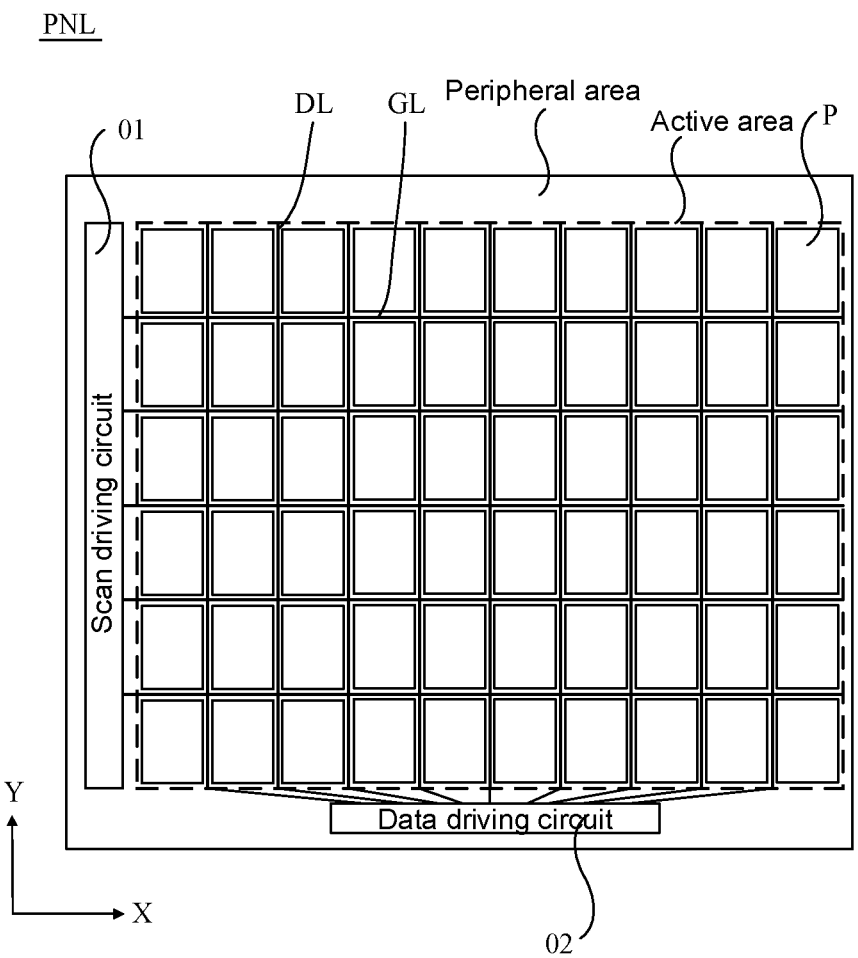
FIG. 1 is a structural diagram of a display panel, in accordance with some embodiments.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics described herein may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, the terms "a plurality of", "the plurality of" and "multiple" each mean two or more unless otherwise specified.

In the description of some embodiments, the expressions "coupled" and "connected" and derivatives thereof may be used. For example, the term "connected" may be used in the description of some embodiments to indicate that two or more components are in direct physical or electrical contact with each other. As another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the context herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, depending on the context, the term "if" is optionally construed as "when", "in a case where", "in response to determining" or "in response to detecting". Similarly, depending on the context, the phrase "if it is determined" or "if [a stated condition or event] is detected" is optionally construed as "in a case where it is determined", "in response to determining", "in a case where [the stated condition or event] is detected", or "in response to detecting [the stated condition or event]".

The phrase "applicable to" or "configured to" as used herein means an open and inclusive expression, which does not exclude devices that are applicable to or configured to perform additional tasks or steps.

In addition, the phase "based on" used is meant to be open and inclusive, since a process, step, calculation or other action that is "based on" one or more of the stated conditions or values may, in practice, be based on additional conditions or values exceeding those stated.

As used herein, the term such as "about" or "approximately" includes a stated value and an average value within an acceptable range of deviation of a particular value. The acceptable range of deviation is determined by a person of ordinary skill in the art in view of the measurement in question and the error associated with the measurement of a particular quantity (i.e., the limitation of the measurement system).

Exemplary embodiments are described herein with reference to sectional views and/or plan views as idealized exemplary drawings. In the drawings, thicknesses of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of regions in an apparatus, and are not intended to limit the scope of the exemplary embodiments.

Some embodiments of the present disclosure provide a shift register and a driving method thereof, a scan driving circuit, a display panel and a display apparatus, each of which will be described below.

Figure 15:
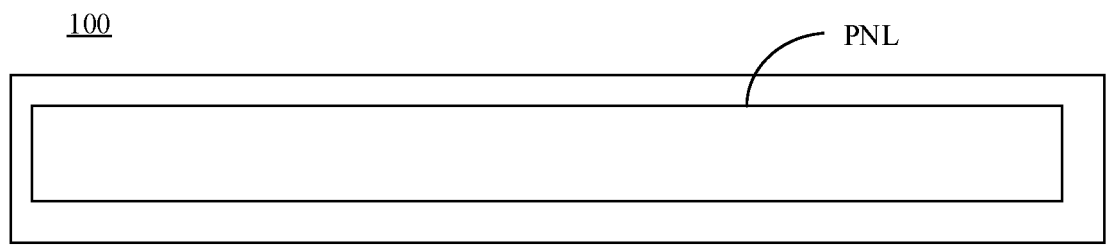
FIG. 15 is a structural diagram of a display apparatus, in accordance with some embodiments.

Embodiments of the present disclosure provide the display apparatus. As shown in FIG. 15, the display apparatus 100 may be any apparatus that displays images whether in motion (e.g., a video) or stationary (e.g., a still image), and whether literal or graphical. More specifically, it is anticipated that the embodiments may be implemented in or associated with a variety of electronic devices. The variety of electronic devices include (but are not limit to), for example, mobile phones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, television monitors, flat panel displays, computer monitors, automobile displays (such as odometer displays), navigators, cockpit controllers and/or displays, camera view displays (e.g., rear view camera displays in a vehicle), electronic photos, electronic billboards or signs, projectors, architectural structures, packaging and aesthetic structures (e.g., displays for displaying an image of a piece of jewelry).

The display apparatus includes a bezel, and the display panel, a circuit board, a display driver integrated circuit (IC) and other electronic components that are disposed in the bezel.

The display panel may be an organic light-emitting diode (OLED) display panel, a quantum dot light-emitting diode (QLED) display panel, a micro light-emitting diode (Micro LED) display panel, which is not specifically limited in the embodiments of the present disclosure.

The description will be made by considering an example in which the display panel is the OLED display panel in following embodiments of the present disclosure.

As shown in FIG. 1, the display panel PNL has an active area AA (also referred to as an active display area), and a peripheral area disposed around the active area AA.

The display panel PNL includes sub-pixels P of a plurality of colors in the active area AA, and the sub-pixels of the plurality of colors include at least sub-pixels of a first color, sub-pixels of a second color and sub-pixels of a third color. The first color, the second color and the third color may be three primary colors (e.g., red, green and blue).

For convenience of description, in the embodiments of the present disclosure, a plurality of sub-pixels P are described by considering an example in which the plurality of sub-pixels P are arranged in a matrix. In this case, sub-pixels P arranged in a line in a horizontal direction X are referred to as a same row of sub-pixels, and sub-pixels P arranged in a line in a vertical direction Y are referred to as a same column of sub-pixels.

Figure 2:
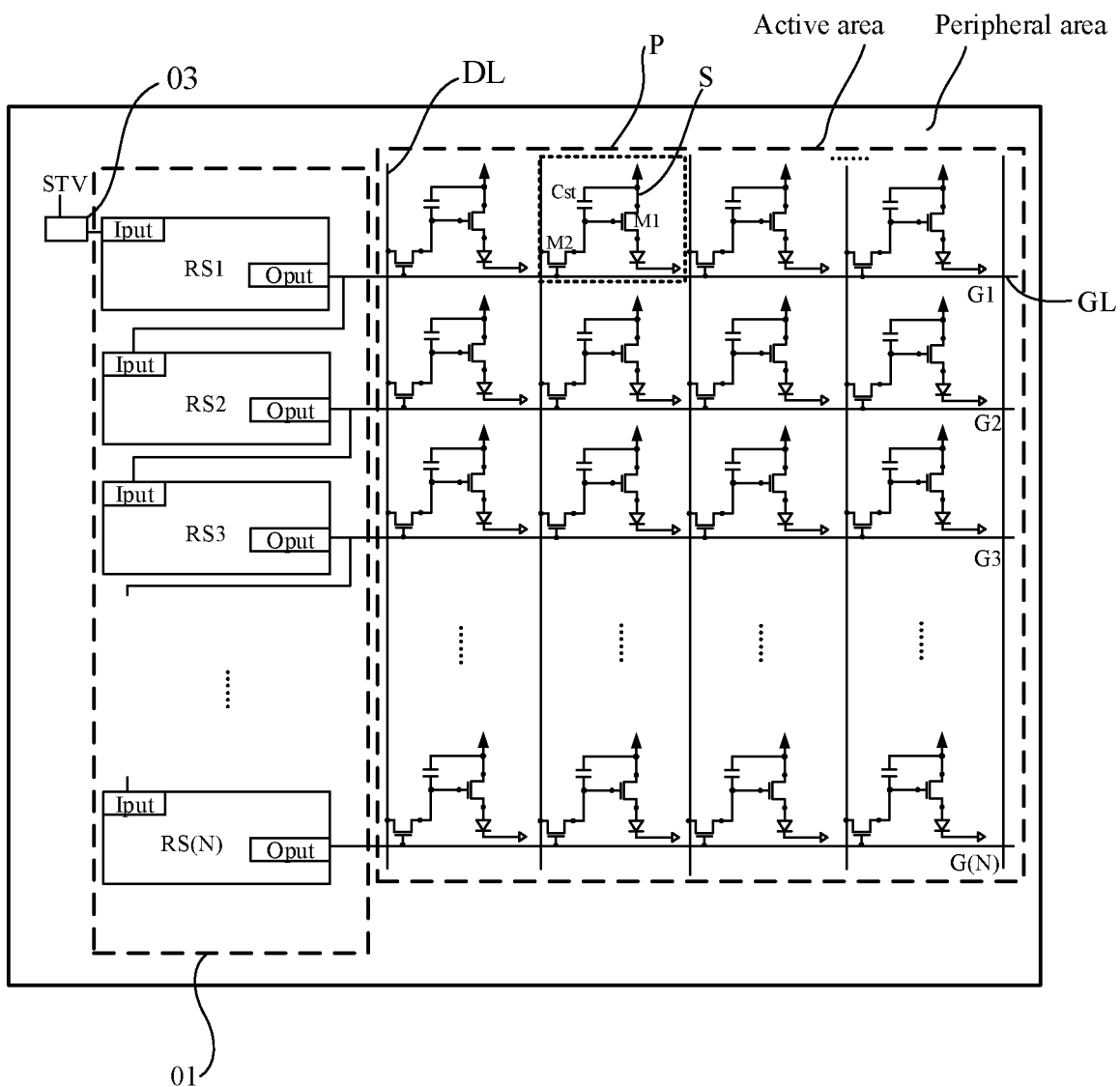
FIG. 2 is a structural diagram of another display panel, in accordance with some embodiments.

As shown in FIG. 2, in the OLED display panel PNL, each sub-pixel P has a pixel circuit (also referred to as a pixel driving circuit) S, and the pixel circuit S includes transistors and capacitor(s). FIG. 2 is illustrated by considering an example where the pixel circuit S is of a 2T1C structure (one driving transistor M1, one switching transistor M2 and one capacitor Cst), and a structure of the pixel circuit is not limited in the embodiments of the present disclosure. For example, the pixel circuit may be of a 3T1C structure, a 4T1C structure or a 7T1C structure. As shown in FIG. 2, in the display panel PNL, control electrodes of switching transistors M2 of pixel circuits S located in a same row are coupled to a same gate line GL, and electrodes (e.g., sources) of switching transistor M2 of pixel circuits S located in a same column are coupled to a same data line DL.

The peripheral area of the display panel PNL is provided therein with scan driving circuit(s) 01 and a data driving circuit 02. In some embodiments, referring to FIG. 1, a scan driving circuit 01 may be disposed at a side of the display panel PNL in an extending direction of the gate line GL, and the data driving circuit 02 may be disposed at a side of the display panel PNL in an extending direction of the data line DL, so that the pixel circuits S in the display panel are driven to achieve display.

In some embodiments, the scan driving circuit 01 may include a gate driver IC and a light-emitting driver IC. In some other embodiments, the scan driving circuit 01 may be a gate on array (GOA) circuit, that is, the scan driving circuit 01 is directly integrated in an array substrate of the display panel PNL. By setting the scan driving circuit 01 as the GOA circuit rather than a scan driver IC, it may be possible to not only reduce costs for manufacturing the display panel, but also reduce the bezel width of the display 5 apparatus. The following embodiments are described by considering an example in which the scan driving circuit 01 is the GOA circuit.

It will be noted that, FIGS. 1 and 2 are merely illustrative, and are described in an example in which the scan driving circuit 01 is arranged at a single side of the display panel PNL in the peripheral region, and gate lines GL are sequentially driven row by row (that is, the gate lines GL are driven in a single-side driving manner). In some other embodiments, scan driving circuits may be arranged at two sides, in the extending direction of the gate line GL, of the display panel PNL in the peripheral region, and the gate lines GL are sequentially driven row by row through the two scan driving circuits from two sides simultaneously (that is, the gate lines GL are driven in a double-side driving manner). In some other embodiments, scan driving circuits may be arranged at two sides, in the extending direction of the gate line GL, of the display panel PNL in the peripheral region, and the gate lines GL are sequentially driven row by row through the two scan driving circuits from two sides alternately (that is, the gate lines GL are driven in an alternated driving manner). The following embodiments of the present disclosure are described by considering an example in which the gate lines GL are driven in the single-side driving manner.

As shown in FIG. 2, the scan driving circuit 01 includes N shift registers (RS1, RS2, . . . , RS(N)) that are cascaded. In this case, the display panel PNL further includes N gate lines (G1, G2, . . . , G(N)) that are coupled in one-to-one correspondence to the N shift registers (RS1, RS2, . . . , RS(N)) that are cascaded. N is a positive integer.

In addition, as shown in FIG. 2, in some embodiments of the present disclosure, the shift registers (RS1, RS2, . . . , RS(N)) in the scan driving circuit 01 are each provided with an input signal terminal Input (abbreviated as Iput in the figures and following context) and a scan signal terminal Output (abbreviated as Oput in the figures and following context). In addition, each shift register in the scan driving circuit 01 may have the same circuit structure.

Based on this, in the scan driving circuit 01, an input signal terminal Iput of a first shift register or input signal terminals Iput of first several shift registers are coupled to a frame start signal terminal STV. In addition to the shift register(s) that are coupled to the frame start signal terminal STV, an input signal terminal Iput of a succeeding shift register is coupled to a scan signal terminal Oput of a preceding shift register. Here, the preceding shift register and the succeeding shift register may be shift registers located at adjacent stages, or may not be the shift registers located at adjacent stages.

For example, as shown in FIG. 2, in the scan driving circuit 01, the input signal terminal Iput of the first shift register RS1 may be coupled to the frame start signal terminal STV, an input signal terminal Iput of a second shift register RS2 may be coupled to a scan signal terminal Oput of the first shift register RS1, and a scan signal terminal Oput of an i-th shift register RSi may be coupled to an input signal terminal Iput of an (i+1)-th shift register RS(i+1), where i is a positive integer greater than or equal to 2 and less than or equal to (N−1), (i.e., 2≤i≤(N−1)).

The shift registers provided in the embodiments of the present disclosure may be respectively coupled to the pixel circuits in FIG. 2, so as to control transistors in the pixel circuits to be turned on or off. The pixel circuit may be of a 7T1C structure, a 7T2C structure, a 8T1C structure, a 8T2C structure, or a 4T1C structure. Transistor(s) in the pixel circuit coupled to the shift register may be all P-type transistor(s), or all N-type transistor(s); alternatively, some of the transistor(s) may be P-type transistors and the other of the transistor(s) may be N-type transistors. Moreover, the transistors in the pixel circuit may be low temperature polycrystalline oxide (LTPO) transistors.

As shown in FIG. 2, in some embodiments, the peripheral area of the display panel PNL may further be provided therein with a pulse width adjustment module 03. The pulse width adjustment module 03 is coupled to the scan driving circuit 01 and the frame start signal terminal STV. The pulse width adjustment module 03 is configured to adjust a pulse width of a frame start signal provided by the frame start signal terminal STV, and provide a frame start signal after pulse width adjustment to the shift register(s) in the scan driving circuit.

Figure 3:
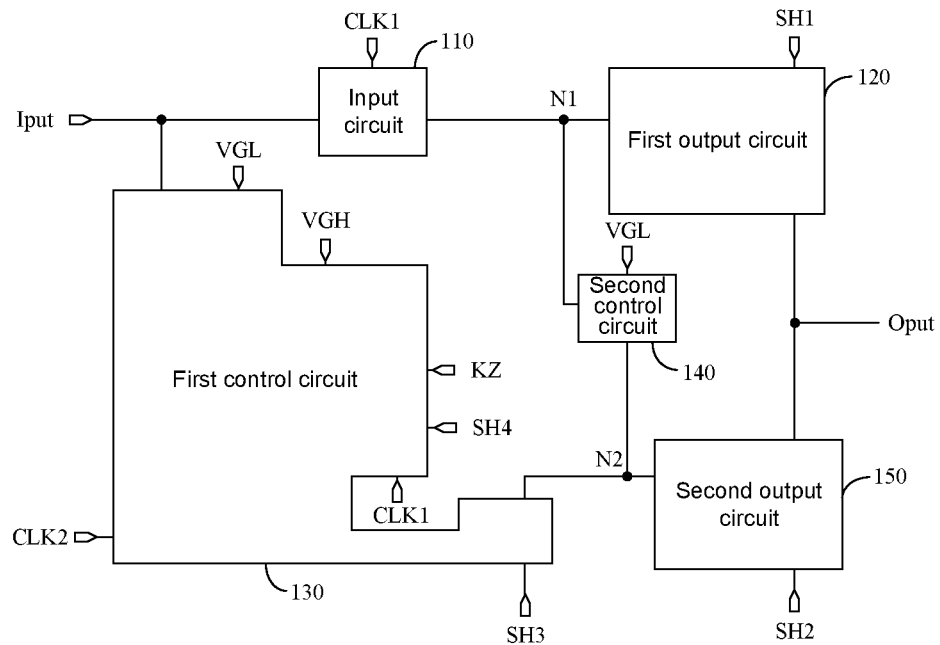
FIG. 3 is a structural diagram of a shift register, in accordance with some embodiments.

Based on this, as shown in FIG. 3, the shift register RS provided in some embodiments of the present disclosure further includes an input circuit 110, a first output circuit 120, a first control circuit 130, a second control circuit 140 and a second output circuit 150.

The input circuit 110 is coupled to the input signal terminal Iput, a first clock signal terminal CLK1 and a first node N1. The input circuit 110 is configured to transmit an input signal provided by the input signal terminal Iput to the first node N1 under control of a first clock signal provided by the first clock signal terminal CLK1.

The first output circuit 120 is coupled to the first node N1, a first output signal terminal SH1, and the scan signal terminal Oput. The first output circuit 120 is configured to transmit a first output signal provided by the first output signal terminal SH1 to the scan signal terminal Oput under control of a potential at the first node N1.

The first control circuit 130 is coupled to the input signal terminal Iput, a first voltage signal terminal VGL, the first clock signal terminal CLK1, a second voltage signal terminal VGH, a second clock signal terminal CLK2, a third output signal terminal SH3 and a second node N2. The first control circuit 130 is configured to transmit a third output signal provided by the third output signal terminal SH3 to the second node N2 under control of the input signal provided by the input signal terminal Iput, a second clock signal provided by the second clock signal terminal CLK2, and the first clock signal provided by the first clock signal terminal CLK1.

Optionally, the first control circuit 130 is coupled to the input signal terminal Iput, the first voltage signal terminal VGL, the first clock signal terminal CLK1, the second voltage signal terminal VGH, the second clock signal terminal CLK2, the third output signal terminal SH3, a fourth output signal terminal SH4, a control signal terminal KZ and the second node N2. The first control circuit 130 is configured to transmit the third output signal provided by the third output signal terminal SH3 to the second node N2 under control of the input signal provided by the input signal terminal Iput, the second clock signal provided by the second clock signal terminal CLK2, a control signal provided by the control signal terminal KZ and the first clock signal provided by the first clock signal terminal CLK1.

The second control circuit 140 is coupled to the first node N1 and the second node N2. The second control circuit 140 is configured to control the potential at the first node N1 and a potential at the second node N2 to be two inverted potentials.

Optionally, the second control circuit 140 is coupled to the first node N1, the first voltage signal terminal VGL and the second node N2. The second control circuit 140 is configured to control the potential at the first node N1 and the potential at the second node N2 to be two inverted potentials. For example, the second control circuit 140 is configured to transmit a first voltage signal provided by the first voltage signal terminal VGL to the second node N2 under control of the potential at the first node N1.

The second output circuit 150 is coupled to the second node N2, a second output signal terminal SH2 and the scan signal terminal Oput. The second output circuit 150 is configured to transmit a second output signal provided by the second output signal terminal SH2 to the scan signal terminal under control of the potential at the second node N2.

The first clock signal provided by the first clock signal terminal CLK1 and the second clock signal provided by the second clock signal terminal CLK2 may be mutually two inverted signals. For example, in a case where the first clock signal is at a high potential, the second clock signal is at a low potential; and in a case where the first clock signal is at the low potential, the second clock signal is at the high potential.

Optionally, the first voltage signal terminal may be one of a low voltage signal terminal and a high voltage signal terminal, and the second voltage signal terminal may be another of the low voltage signal terminal and the high voltage signal terminal. Of course, a signal provided by the first voltage signal terminal or the second voltage signal terminal may be another signal (e.g., a clock signal). For example, the signal provided by the first voltage signal terminal is the first clock signal. In the embodiments of the present disclosure, the first voltage signal terminal VGL and the second voltage signal terminal VGH are merely exemplarily described, and should not be regarded as limitation on the first voltage signal terminal and the second voltage signal terminal.

The first output signal terminal SH1 may include one of the first voltage signal terminal VGL and the second voltage signal terminal VGH, and the second output signal terminal SH2 may include another of the first voltage signal terminal VGL and the second voltage signal terminal VGH. For example, the first output signal terminal SH1 includes the first voltage signal terminal VGL, and the second output signal terminal SH2 includes the second voltage signal terminal VGH. As another example, the first output signal terminal SH1 includes the second voltage signal terminal VGH, and the second output signal terminal SH2 includes the first voltage signal terminal VGL.

Figure 4:
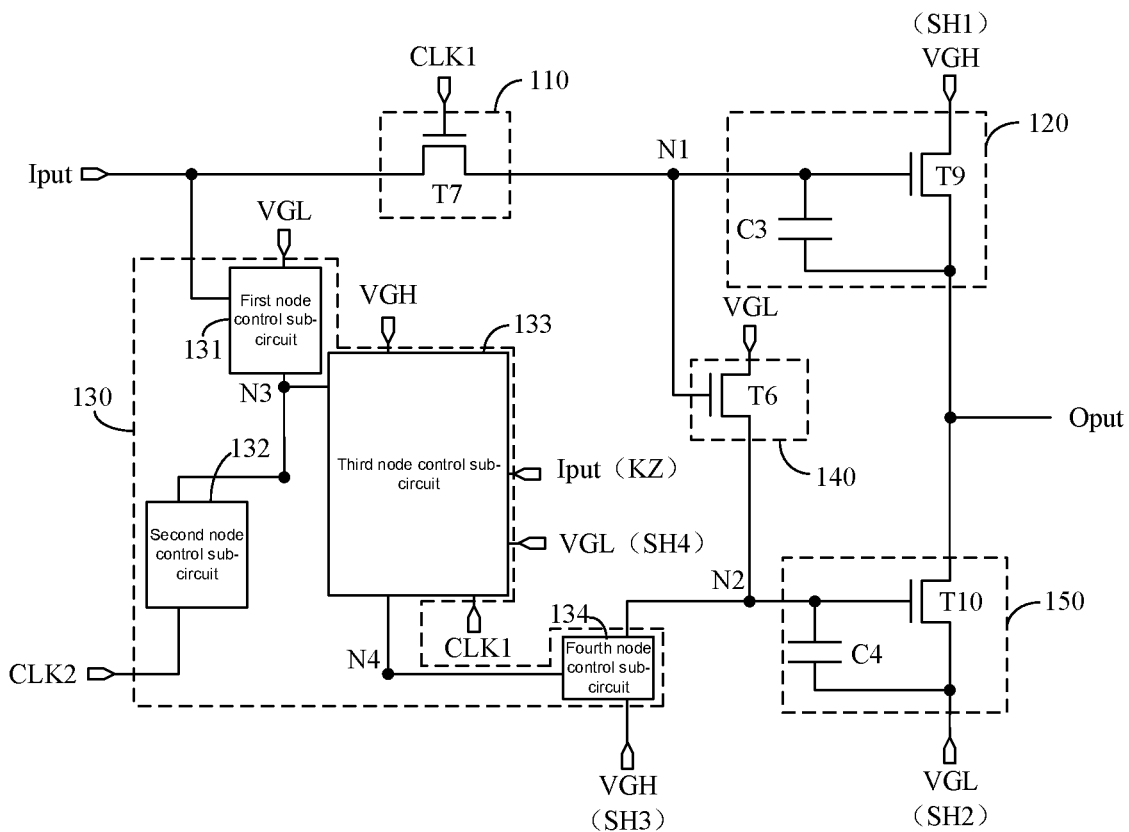
FIG. 4 is a structural diagram of another shift register, in accordance with some embodiments.

The shift register RS may be configured to control the N-type transistors to be turned on or off, or may be configured to control the P-type transistors to be turned on or off. As shown in FIG. 4, in some examples, in a case where the first output signal terminal SH1 includes the second voltage signal terminal VGH, and the second output signal terminal SH2 includes the first voltage signal terminal VGL, the shift register RS is configured to control the N-type transistors to be turned on or off. In some other examples, in a case where the first output signal terminal SH1 includes the first voltage signal terminal VGL, and the second output signal terminal SH2 includes the second voltage signal terminal VGH, the shift register RS is configured to control the P-type transistors to be turned on or off.

As shown in FIG. 4, on a basis that the shift register RS is configured to control the N-type transistors to be turned on or off, the second control circuit 140 may control the potential at the second node N2 to be an inversion of the potential at the first node N1 based on the potential at the first node N1. For example, in a case where the potential at the first node N1 is a high potential, the second control circuit 140 controls the second node N2 to be communicated with the first voltage signal terminal VGL.

On a basis that the shift register RS is configured to control the P-type transistors to be turned on or off, the second control circuit 140 may control the potential at the second node N2 to be an inversion of the potential at the first node N1 based on the potential at the first node N1. For example, in a case where the potential at the first node N1 is a low potential, the second control circuit 140 controls the second node N2 to be communicated with the second voltage signal terminal VGH.

In the embodiments of the present disclosure, the following will be described by considering an example in which the shift register RS controls the N-type transistors, that is, in following context, the first output signal terminal SH1 is the second voltage signal terminal VGH, and the second output signal terminal SH2 is the first voltage signal terminal VGL. However, it is not as limitation on the first output signal terminal SH1 and the second output signal terminal SH2.

Control of the shift register RS on the P-type transistors may be reasonably derived according to the control of the shift register RS on the N-type transistors, and is also included in the protection scope of the present disclosure.

The third output signal terminal SH3 may include one of the second voltage signal terminal VGH and the second clock signal terminal CLK2.

The fourth output signal terminal SH4 may include one of the first voltage signal terminal VGL and the second clock signal terminal CLK2.

The control signal terminal KZ may include one of the input signal terminal Iput and the second clock signal terminal CLK2.

In a case where the third output signal terminal SH3 include the second clock signal terminal CLK2, the fourth output signal terminal SH4 include the second clock signal terminal CLK2, and the control signal terminal KZ include the second clock signal terminal CLK2, the first control circuit 130 may be only coupled to the input signal terminal Iput, the first voltage signal terminal VGL, the first clock signal terminal CLK1, the second voltage signal terminal VGH, the second clock signal terminal CLK2 and the second node N2. The second clock signal terminal CLK2 may serve as the third output signal terminal SH3.

In some examples, as shown in FIG. 4, the first output signal terminal SH1 includes the second voltage signal terminal VGH, the second output signal terminal SH2 includes the first voltage signal terminal VGL, the third output signal terminal SH3 includes the second voltage signal terminal VGH, the fourth output signal terminal SH4 includes the first voltage signal terminal VGL, and the control signal terminal includes the input signal terminal Iput.

In some other examples, the first output signal terminal SH1 includes the second voltage signal terminal VGH, the second output signal terminal SH2 includes the first voltage signal terminal VGL, the third output signal terminal SH3 includes the second clock signal terminal CLK2, the fourth output signal terminal SH4 includes the first voltage signal terminal VGL, and the control signal terminal includes the second clock signal terminal CLK2.

It can be understood that, the input circuit 110 may control the potential at the first node N1, and thus control, through the potential at the first node N1, the first output circuit 120 to transmit the first output signal provided by the first output signal terminal SH1 (e.g., the second voltage signal provided by the second voltage signal terminal VGH) to the scan signal terminal Oput. The first control circuit 130 and the second control circuit 140 may jointly control the potential at the second node N2, and thus control, through the potential at the second node N2, the second output circuit 150 to transmit the second output signal provided by the second output signal terminal SH2 (e.g., the first voltage signal provided by the first voltage signal terminal VGL) to the scan signal terminal Oput.

As for the first control circuit 130, in a case where the input signal provided by the input signal terminal Iput is at an effective potential (e.g., a low potential), the first clock signal provided by the first clock signal terminal CLK1 and the second clock signal provided by the second clock signal terminal CLK2 can control the first control circuit 130 to periodically provide the third output signal (e.g., the second voltage signal) to the second node N2 and make the potential at the second node N2 maintain at an effective potential (e.g., a high potential), thereby achieving that the second output circuit 150 continuously transmits the second output signal provided by the second output signal terminal SH2 (e.g., the first voltage signal provided by the first voltage signal terminal VGL) to the scan signal terminal Oput. Therefore, by controlling a duration of the input signal at the effective potential (e.g., the low potential), the second output circuit 150 may be used to adjust the duration of the effective potential (e.g., an low potential) of the first output signal output continuously by the scan signal terminal Oput, so as to achieve adjustment of the duration of the effective potential (e.g., the low potential) of the first output signal output by the scan signal terminal Oput.

In summary, in the shift register provided in the embodiments of the present disclosure, the input circuit 110, the first output circuit 120, the first control circuit 130, the second control circuit 140 and the second output circuit 150 cooperate with each other, so that the scan signal terminal Oput outputs the first voltage signal or the second voltage signal. As a result, the transistors in the pixel circuit are controlled to be turned on or off. In addition, by adjusting the duration of the effective potential of the input signal, it may be possible to adjust the duration of the first voltage signal output by the scan signal terminal Oput, thereby improving the flexibility of the output of the scan signal terminal Oput. As a result, it may optimize the light-emitting duration of the light-emitting device in the display apparatus, and thus improve the display effect of the display apparatus.

In addition, it will be understood by those skilled in the art that, for the shift register itself, in addition to the input circuit 110, the first output circuit 120, the first control circuit 130, the second control circuit 140 and the second output circuit 150, the shift register may further include other related control circuit(s) coupled to the first node N1 and the second node N2, which is not limited in the embodiments of the present disclosure, and in practice, appropriate related circuit(s) may be provided according to requirements.

As shown in FIG. 4, the first control circuit 130 is coupled to the input signal terminal Iput, the first voltage signal terminal VGL, the first clock signal terminal CLK1, the second voltage signal terminal VGH, the second clock signal terminal CLK2, the third output signal terminal SH3, the fourth output signal terminal SH4, the control signal terminal KZ and the second node N2. The first control circuit 130 is configured to transmit the third output signal provided by the third output signal terminal SH3 to the second node N2 under the control of the input signal provided by the input signal terminal Iput, the second clock signal provided by the second clock signal terminal CLK2, the control signal provided by the control signal terminal KZ and the first clock signal provided by the first clock signal terminal CLK1. Based on this, in some embodiments, the first control circuit 130 includes a first node control sub-circuit 131, a second node control sub-circuit 132, a third node control sub-circuit 133 and a fourth node control sub-circuit 134.

The first node control sub-circuit 131 is coupled to the input signal terminal Iput, the first voltage signal terminal VGL and a third node N3. The first node control sub-circuit is configured to transmit the first voltage signal provided by the first voltage signal terminal VGL to the third node N3 under the control of the input signal provided by the input signal terminal Iput.

Figure 5:
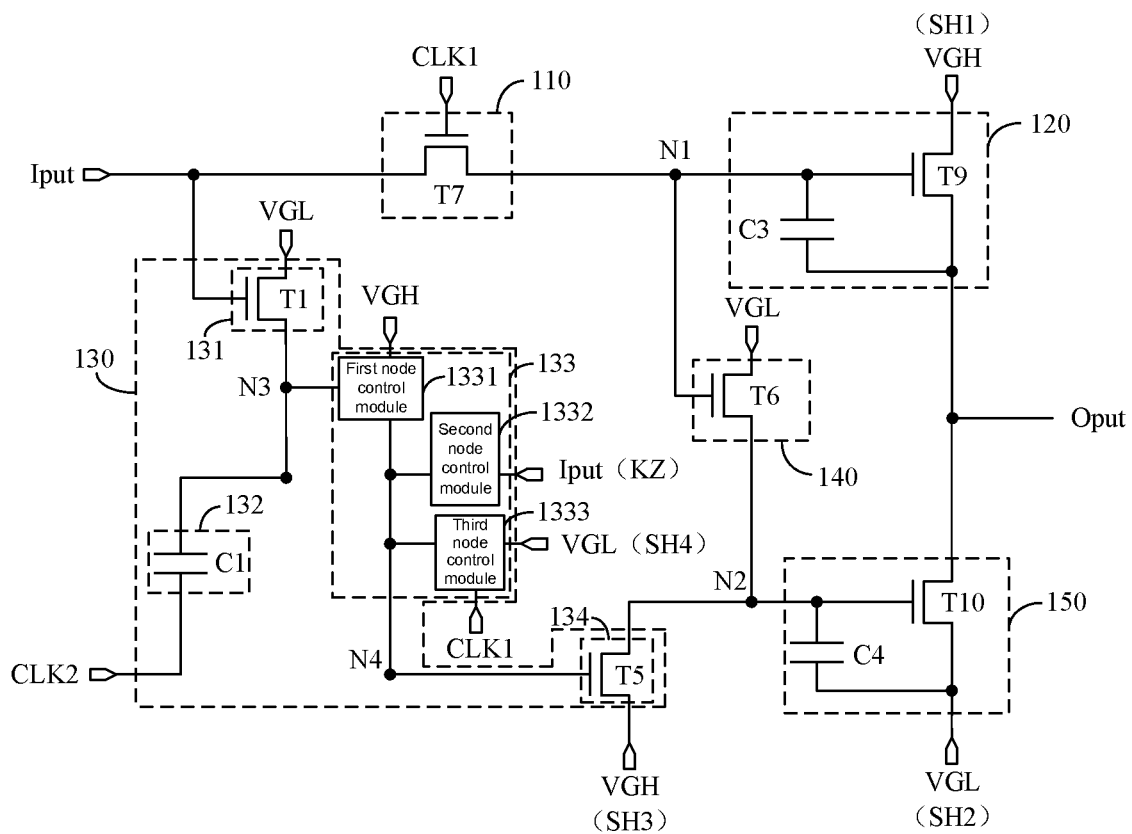
FIG. 5 is a structural diagram of yet another shift register, in accordance with some embodiments.

As shown in FIG. 5, in some examples, the first node control sub-circuit 131 may include a first transistor T1. A control electrode of the first transistor T1 is coupled to the input signal terminal Iput, a first electrode of the first transistor T1 is coupled to the first voltage signal terminal VGL, and a second electrode of the first transistor T1 is coupled to the third node N3. The first transistor T1 is configured to transmit the first voltage signal provided by the first voltage signal terminal VGL to the third node N3 under the control of the input signal provided by the input signal terminal Iput. For example, in a case where the first transistor T1 is an N-type transistor, and the input signal is a high-potential signal, the first transistor T1 transmits the first voltage signal to the third node N3.

As shown in FIG. 4, the second node control sub-circuit 132 is coupled to the second clock signal terminal CLK2 and the third node N3. The second node control sub-circuit is configured to raise or lower a potential at the third node N3 under control of the second clock signal provided by the second clock signal terminal CLK2.

As shown in FIG. 5, in some examples, the second node control sub-circuit 132 may include a first capacitor C1. A first electrode plate of the first capacitor C1 is coupled to the second clock signal terminal CLK2, and a second electrode plate of the first capacitor C1 is coupled to the third node N3. The first capacitor C1 is configured to raise or lower the potential at the third node N3 under the control of the second clock signal provided by the second clock signal terminal CLK2.

Due to the bootstrap effect of the capacitor, a potential difference between the two electrode plates of the capacitor does not suddenly change, and when a potential of one electrode plate of the capacitor changes, a potential of another electrode plate of the capacitor changes accordingly. For example, when the potential of the first plate of the capacitor rises, the potential of the second plate of the capacitor rises synchronously.

It can be understood that the first node control sub-circuit 131 and the second node control sub-circuit 132 jointly control the potential at the third node N3. In a case where the first voltage signal terminal VGL is disconnected from the third node N3, the second node control sub-circuit 132 raises or lowers the potential at the third node N3, so as to control the potential at the third node N3. In a case where the first voltage signal terminal VGL is communicated with the third node N3, the first voltage signal is transmitted to the third node N3, so that the potential at the third node N3 is the same as the potential of the first voltage signal.

As shown in FIG. 4, the third node control sub-circuit 133 is coupled to the second voltage signal terminal VGH, the control signal terminal KZ, the fourth output signal terminal SH4, the first clock signal terminal CLK1, the third node N3 and a fourth node N4. The third node control sub-circuit 133 is configured to raise or lower a potential at the fourth node N4 under control of the potential at the third node N3, the first clock signal provided by the first clock signal terminal CLK1, and the control signal provided by the control signal terminal KZ.

It can be understood that, the third node control sub-circuit 133 controls the potential at the fourth node N4 according to the potential at the third node N3, the first clock signal provided by the first clock signal CLK1 and the control signal provided by the control signal terminal KZ.

As shown in FIG. 4, the fourth node control sub-circuit 134 is coupled to the fourth node N4, the third output signal terminal SH3 and the second node N2. The fourth node control sub-circuit 134 is configured to transmit the third output signal provided by the third output signal terminal SH3 to the second node N2 under control of the potential at the fourth node N4.

As shown in FIG. 5, in some examples, the fourth node control sub-circuit 134 may include a fifth transistor T5. A control electrode of the fifth transistor T5 is coupled to the fourth node N4, a first electrode of the fifth transistor T5 is coupled to the third output signal terminal SH3, and a second electrode of the fifth transistor T5 is coupled to the second node N2. The fifth transistor T5 is configured to transmit the third output signal provided by the third output signal terminal SH3 to the second node N2 under the control of the potential at the fourth node N4. For example, in a case where the fifth transistor T5 is an N-type transistor, and the potential at the fourth node N4 is a high potential, the fifth transistor T5 transmits the third output signal to the second node N2.

Considering an example in which the third output signal terminal SH3 is the second voltage signal terminal, the control electrode of the fifth transistor T5 is coupled to the fourth node N4, the first electrode of the fifth transistor T5 is coupled to the second voltage signal terminal VGH, and the second electrode of the fifth transistor T5 is coupled to the second node N2. The fifth transistor T5 is configured to transmit the second voltage signal provided by the second voltage signal terminal VGH to the second node N2 under the control of the potential at the fourth node N4.

It can be understood that the fourth node control sub-circuit 134 controls the potential at the second node N2 according to the potential at the fourth node N4.

As shown in FIG. 5, in some embodiments, the third node control sub-circuit 133 includes a first node control module 1331, a second node control module 1332, and a third node control module 1333.

The first node control module 1331 is coupled to the third node N3, the second voltage signal terminal VGH and the fourth node N4. The first node control module 1331 is configured to transmit the second voltage signal provided by the second voltage signal terminal VGH to the fourth node N4 under control of the potential at the third node N3.

Figure 6:
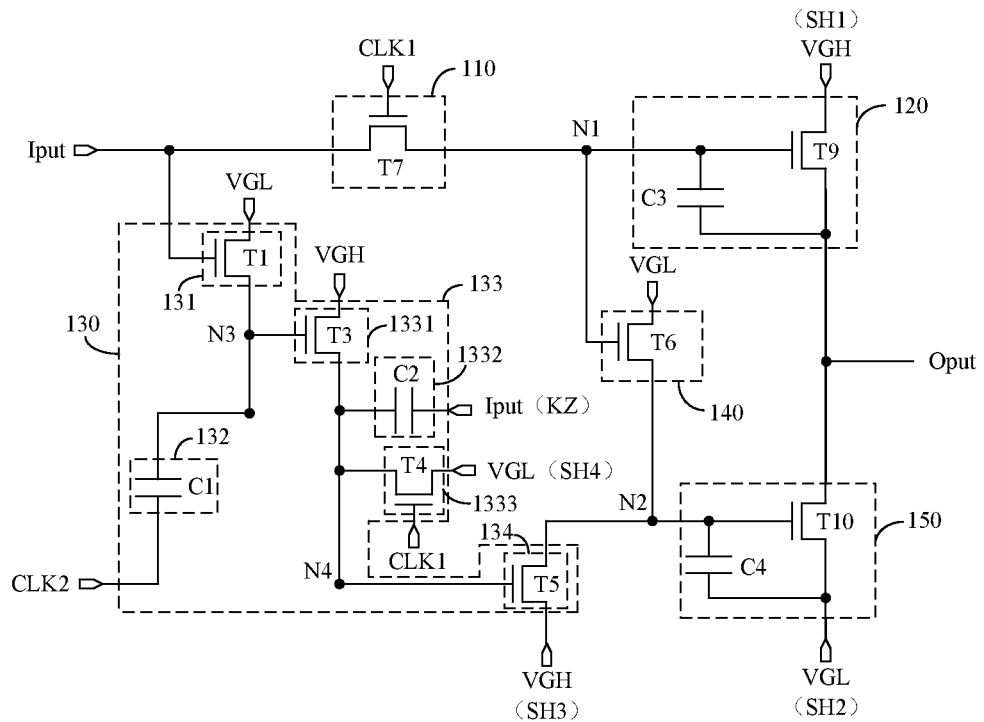
FIG. 6 is a structural diagram of yet another shift register, in accordance with some embodiments.

As shown in FIG. 6, in some examples, the first node control module 1331 may include a third transistor T3. A control electrode of the third transistor T3 is coupled to the third node N3, a first electrode of the third transistor T3 is coupled to the second voltage signal terminal VGH, and a second electrode of the third transistor T3 is coupled to the fourth node N4. The third transistor T3 is configured to transmit the second voltage signal provided by the second voltage signal terminal VGH to the fourth node N4 under the control of the potential at the third node N3. For example, in a case where the third transistor T3 is an N-type transistor, and the potential at the third node N3 is a high potential, the third transistor T3 transmits the second voltage signal to the fourth node N4.

As shown in FIG. 5, the second node control module 1332 is coupled to the fourth node N4 and the control signal terminal KZ. The second node control module 1332 is configured to raise or lower the potential at the fourth node N4 under control of the control signal provided by the control signal terminal KZ.

As shown in FIG. 6, in some examples, the second node control module 1332 may include a second capacitor C2. A first electrode plate of the second capacitor C2 is coupled to the control signal terminal KZ, and a second electrode plate of the second capacitor C2 is coupled to the fourth node N4. The second capacitor C2 is configured to raise or lower the potential at the fourth node N4 under the control of the control signal provided by the control signal terminal KZ. The principle of the capacitor being capable of raising or lowering the potential has been described in detail before, which will not be repeated here.

For example, the first electrode plate of the second capacitor C2 is coupled to the input signal terminal Iput, and the second electrode plate of the second capacitor C2 is coupled to the fourth node N4.

For example, the first electrode plate of the second capacitor C2 is coupled to the second clock signal terminal CLK2, and the second electrode plate of the second capacitor C2 is coupled to the fourth node N4.

As shown in FIG. 5, the third node control module 1333 is coupled to the fourth node N4, the first clock signal terminal CLK1 and the fourth output signal terminal SH4. The third node control module 1333 is configured to transmit a fourth output signal provided by the fourth output signal terminal SH4 to the fourth node N4 under control of the first clock signal provided by the first clock signal terminal CLK1.

As shown in FIG. 6, in some examples, the third node control module 1333 may include a fourth transistor T4. A control electrode of the fourth transistor T4 is coupled to the first clock signal terminal CLK1, a first electrode of the fourth transistor T4 is coupled to the fourth output signal terminal SH4, and a second electrode of the fourth transistor T4 is coupled to the fourth node N4. The fourth transistor T4 is configured to transmit the fourth output signal provided by the fourth output signal terminal SH4 to the fourth node N4 under the control of the first clock signal provided by the first clock signal terminal CLK1. For example, in a case where the fourth transistor T4 is an N-type transistor, and the first clock signal is at a high potential, the fourth transistor T4 transmits the fourth output signal to the fourth node N4.

For example, the control electrode of the fourth transistor T4 is coupled to the first clock signal terminal CLK1, the first electrode of the fourth transistor T4 is coupled to the first voltage signal terminal VGL, and the second electrode of the fourth transistor T4 is coupled to the fourth node N4.

For example, the control electrode of the fourth transistor T4 is coupled to the first clock signal terminal CLK1, the first electrode of the fourth transistor T4 is coupled to the second clock signal terminal CLK2, and the second electrode of the fourth transistor T4 is coupled to the fourth node N4.

The second clock signal and the first clock signal are mutually inverted signals. Considering an example in which the fourth transistor T4 is the N-type transistor, in a case where the first clock signal provided by the first clock signal terminal CLK1 is at the high potential, the fourth transistor T4 is turned on to transmit the low-potential second clock signal provided by the second clock signal terminal CLK2 to the fourth node N4. In this case, the second clock signal terminal CLK2 can only transmit the low-potential second clock signal to the fourth node N4, and the function of the second clock signal terminal CLK2 is the same as that of the first voltage signal terminal VGL. Therefore, the first voltage signal terminal VGL and the second clock signal terminal CLK2 may be interchangeable.

It can be understood that the first node control module 1331, the second node control module 1332 and the third node control module 1333 jointly control the potential at the fourth node N4. The first node control module 1331 is controlled by the third node N3.

In a case where the fourth node N4 is disconnected from both the second voltage signal terminal VGH and the fourth output signal terminal SH4, the second node control module 1332 raises or lowers the potential at the fourth node N4, so as to control the potential at the fourth node N4. In a case where the fourth node N4 is communicated with the second voltage signal terminal VGH, the second voltage signal is transmitted to the fourth node N4, so that the potential at the fourth node N4 is the same as the potential of the second voltage signal. In a case where the fourth node N4 is communicated with the fourth output signal terminal SH4, the fourth output signal is transmitted to the fourth node N4, so that the potential at the fourth node N4 is the same as the potential of the fourth output signal.

Optionally, the case where the fourth node N4 is communicated with the second voltage signal terminal VGH and the case where the fourth node N4 is communicated with the fourth output signal terminal SH4 do not occur simultaneously.

Figure 7:
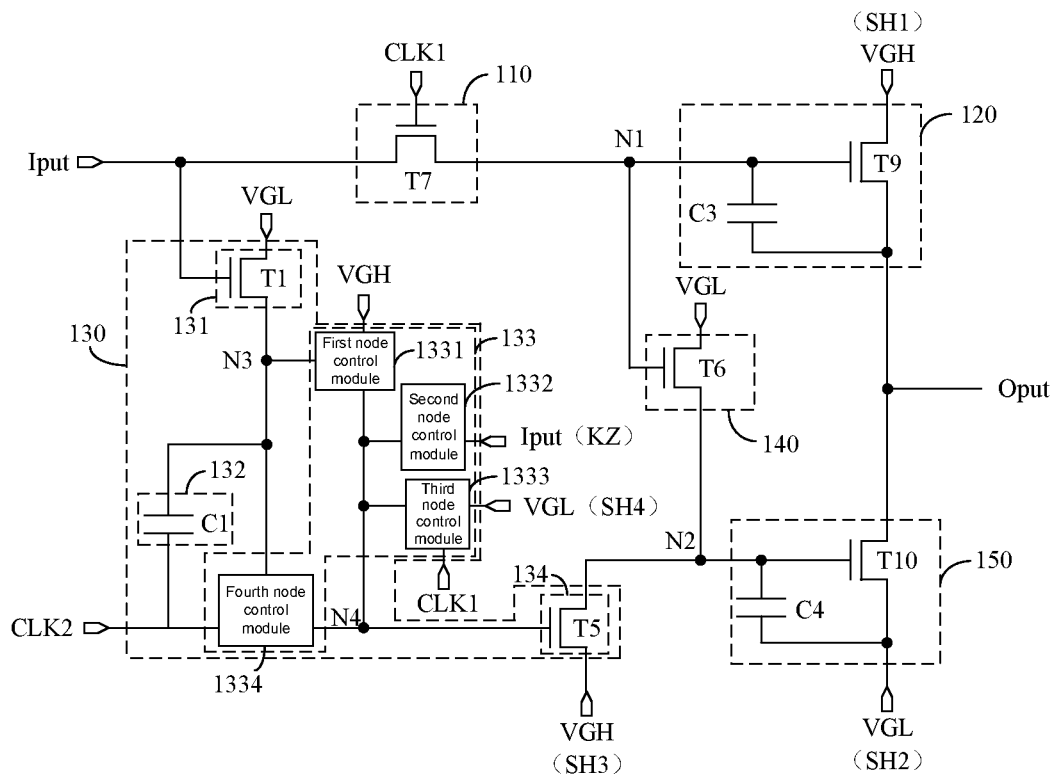
FIG. 7 is a structural diagram of yet another shift register, in accordance with some embodiments.

As shown in FIG. 7, in some embodiments, the third node control sub-circuit 133 further includes a fourth node control module 1334. The fourth node control module 1334 is coupled to the second clock signal terminal CLK2, the third node N3 and the fourth node N4. The fourth node control module 1334 is configured to transmit the second clock signal provided by the second clock signal terminal CLK2 to the fourth node N4 under control of the third node N3.

In a case where the third node control sub-circuit 133 further includes the fourth node control module 1334, both the first node control module 1331 and the fourth node control module 1334 are controlled by the third node N3.

Figure 8:
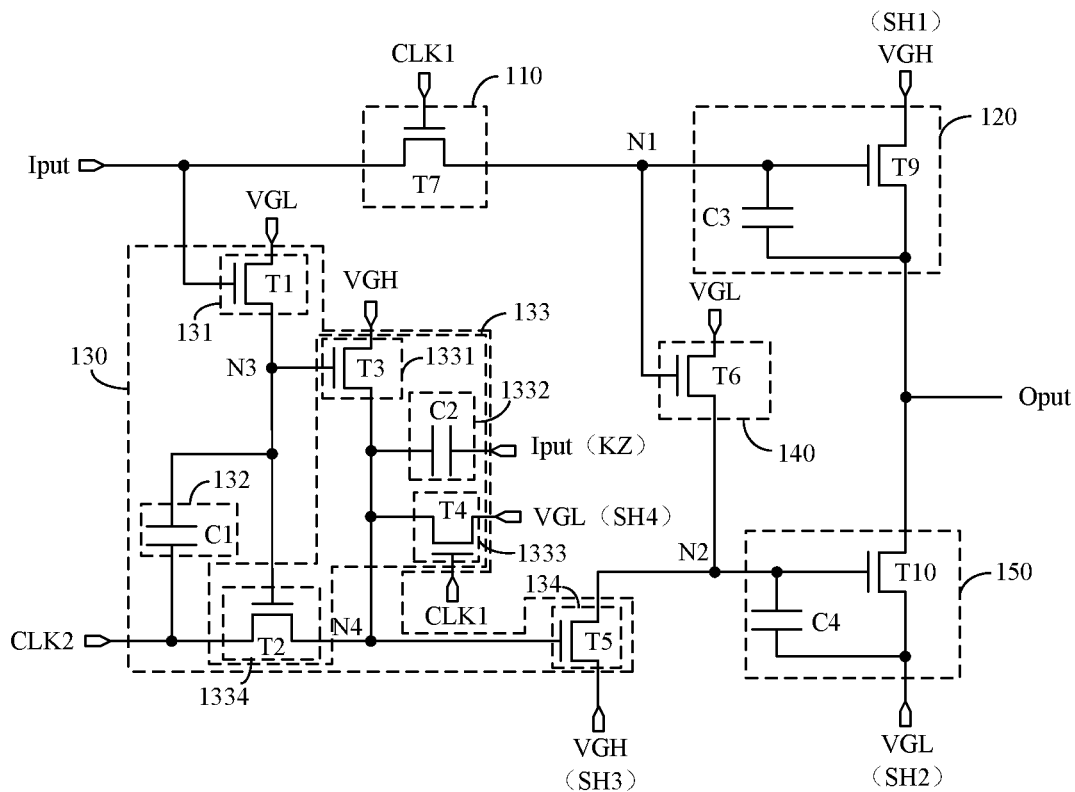
FIG. 8 is a structural diagram of yet another shift register, in accordance with some embodiments.

As shown in FIG. 8, in some examples, the fourth node control module 1334 includes a second transistor T2. A control electrode of the second transistor T2 is coupled to the third node N3, a first electrode of the second transistor T2 is coupled to the second clock signal terminal CLK2, and a second electrode of the second transistor T2 is coupled to the fourth node N4.

The second transistor T2 is configured to transmit the second clock signal provided by the second clock signal terminal CLK2 to the fourth node N4 under the control of the potential at the third node N3. Considering an example in which the second transistor T2 is an N-type transistor, in a case where the potential at the third node N3 is a high potential, the second transistor T2 transmits the second clock signal provided by the second clock signal terminal CLK2 to the fourth node N4.

In the case where the potential at the third node N3 is the high potential, the fourth node N4 is communicated with both the second voltage signal terminal VGH and the second clock signal terminal CLK2, and receives the second voltage signal provided by the second voltage signal terminal VGH and the second clock signal provided by the second clock signal terminal CLK2.

As shown in FIGS. 4 to 8, in some embodiments, the second control circuit 140 includes a sixth transistor T6. A control electrode of the sixth transistor T6 is coupled to the first node N1, a first electrode of the sixth transistor T6 is coupled to the first voltage signal terminal VGL, and a second electrode of the sixth transistor T6 is coupled to the second node N2. The sixth transistor T6 is configured to transmit the first voltage signal provided by the first voltage signal terminal VGL to the second node N2 under the control of the potential at the first node N1.

For example, in a case where the sixth transistor T6 is an N-type transistor, and the potential at the first node N1 is at a high potential, the sixth transistor T6 transmits the first voltage signal provided by the first voltage signal terminal VGL to the second node N2.

The first voltage signal may be transmitted to the second node N2 through the sixth transistor T6 of the second control circuit 140, so that a path between the scan signal terminal Oput and the first voltage signal terminal VGL are disconnected. As a result, the scan signal terminal Oput is controlled to stop outputting the first voltage signal.

As shown in FIGS. 4 to 8, in some embodiments, the input circuit 110 includes a seventh transistor T7. A control electrode of the seventh transistor T7 is coupled to the first clock signal terminal CLK1, a first electrode of the seventh transistor T7 is coupled to the input signal terminal Iput, and a second electrode of the seventh transistor T7 is coupled to the first node N1. The seventh transistor T7 is configured to transmit the input signal provided by the input signal terminal Iput to the first node N1 under the control of the first clock signal provided by the first clock signal terminal CLK1.

For example, in a case where the seventh transistor T7 is an N-type transistor, and the first clock signal is at the high potential, the seventh transistor T7 transmits the input signal provided by the input signal terminal Iput to the first node N1.

The input signal can be transmitted to the first node N1 through the seventh transistor T7 of the input circuit 110. In a case where the input signal is the second voltage signal, the first node N1 controls the first output circuit 120 to form a path between the second voltage signal terminal VGH and the scan signal terminal Oput, so that the scan signal terminal Oput outputs the second voltage signal. In a case where the input signal is the first voltage signal, the first node controls the first output circuit 120 to disconnect the path between the second voltage signal terminal VGH and the scan signal terminal Oput, so that the scan signal terminal Oput stops outputting the second voltage signal.

Figure 9:
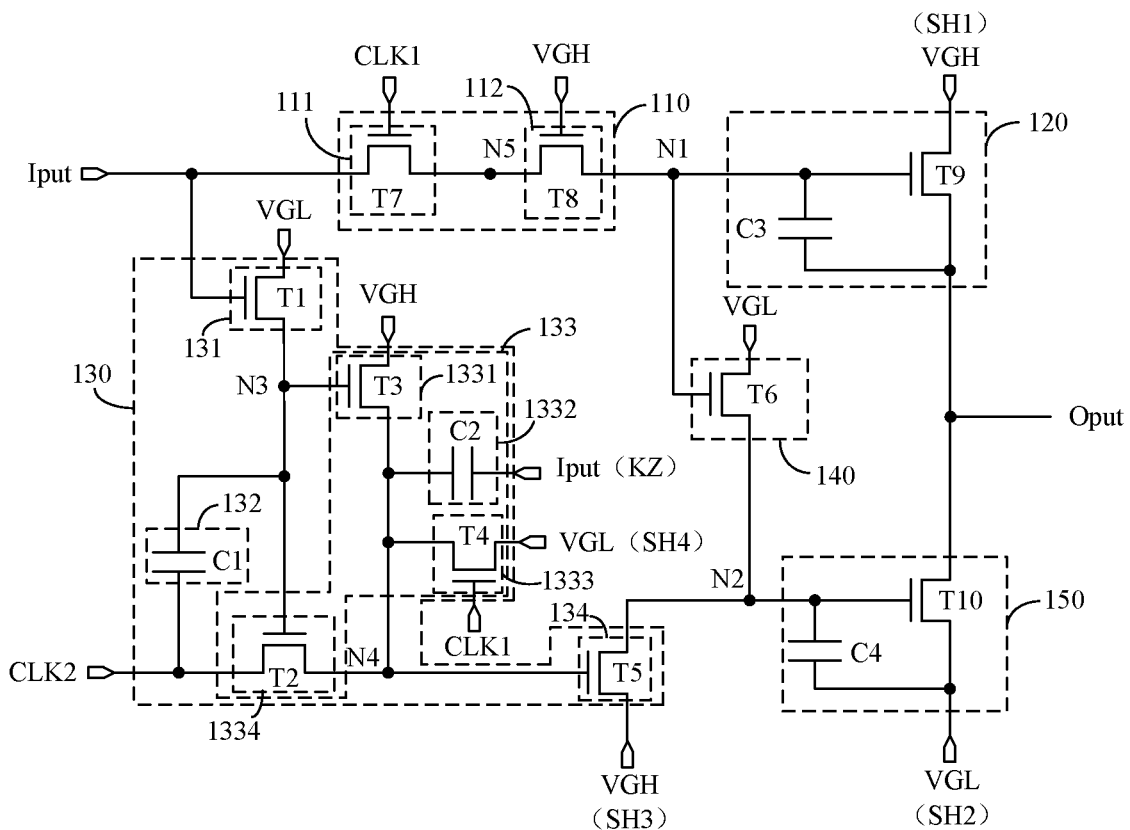
FIG. 9 is a structural diagram of yet another shift register, in accordance with some embodiments.

As shown in FIG. 9, in some other embodiments, the input circuit 110 includes an input sub-circuit 111 and a voltage stabilizing sub-circuit 112. The input sub-circuit 111 is coupled to the input signal terminal Iput, the first clock signal terminal CLK1 and a fifth node N5. The input sub-circuit is configured to transmit the input signal provided by the input signal terminal Iput to the fifth node N5 under the control of the first clock signal provided by the first clock signal terminal CLK1. The voltage stabilizing sub-circuit is coupled to the first node N1, the fifth node N5 and the second voltage signal terminal VGH. The voltage stabilizing sub-circuit is configured to form a path between the first node N1 and the fifth node N5 under control of the second voltage signal provided by the second voltage signal terminal VGH.

In some examples, the input sub-circuit includes a seventh transistor T7. A control electrode of the seventh transistor T7 is coupled to the first clock signal terminal CLK1, a first electrode of the seventh transistor T7 is coupled to the input signal terminal Iput, and a second electrode of the seventh transistor T7 is coupled to the fifth node N5. The seventh transistor T7 is configured to transmit the input signal provided by the input signal terminal Iput to the fifth node N5 under the control of the first clock signal provided by the first clock signal terminal CLK1.

The voltage stabilizing sub-circuit includes an eighth transistor T8. A control electrode of the eighth transistor T8 is coupled to the second voltage signal terminal VGH, a first electrode of the eighth transistor T8 is coupled to the fifth node N5, and a second electrode of the eighth transistor T8 is coupled to the first node N1. The eighth transistor T8 is configured to form the path between the first node N1 and the fifth node N5 under the control of the second voltage signal provided by the second voltage signal terminal VGH.

In the embodiment, by adding the eighth transistor T8 for voltage stabilization between the seventh transistor T7 and the first output circuit 120, the stability of the potential output to the first node N1 may be improved in a case where the potential of the input signal changes, thereby improving the working stability of the shift register.

As shown in FIGS. 4 to 9, in some embodiments, the first output circuit 120 includes a third capacitor C3 and a ninth transistor T9.

A control electrode of the ninth transistor T9 is coupled to the first node N1, a first electrode of the ninth transistor T9 is coupled to the first output signal terminal SH1 (e.g., the second voltage signal terminal VGH), and a second electrode of the ninth transistor T9 is coupled to the scan signal terminal Oput. The ninth transistor T9 is configured to transmit the first output signal provided by the first output signal terminal SH1 (e.g., the second voltage signal provided by the second voltage signal terminal VGH) to the scan signal terminal Oput under the control of the potential at the first node N1.

A first electrode plate of the third capacitor C3 is coupled to the scan signal terminal Oput, and a second electrode plate of the third capacitor C3 is coupled to the first node. The third capacitor C3 is configured to maintain the stability of the potential at the first node N1 in a case where the potential of the scan signal terminal Oput changes.

As shown in FIGS. 4 to 9, in some embodiments, the second output circuit 150 includes a tenth transistor T10 and a fourth capacitor C4.

A control electrode of the tenth transistor T10 is coupled to the second node N2, a first electrode of the tenth transistor T10 is coupled to the second output signal terminal SH2 (e.g., the first voltage signal terminal VGL), and a second electrode of the tenth transistor T10 is coupled to the scan signal terminal Oput. The tenth transistor T10 is configured to transmit the second output signal provided by the second output signal terminal SH2 (e.g., the first voltage signal provided by the first voltage signal terminal VGL) to the scan signal terminal Oput under the control of the potential at the second node N2.

A first electrode plate of the fourth capacitor C4 is coupled to the second output signal terminal SH2, and a second electrode plate of the fourth capacitor C4 is coupled to the second node. The fourth capacitor C4 is configured to maintain the stability of the potential at the second node N2 in a case where the potential of the scan signal terminal Oput changes.

Figure 11:
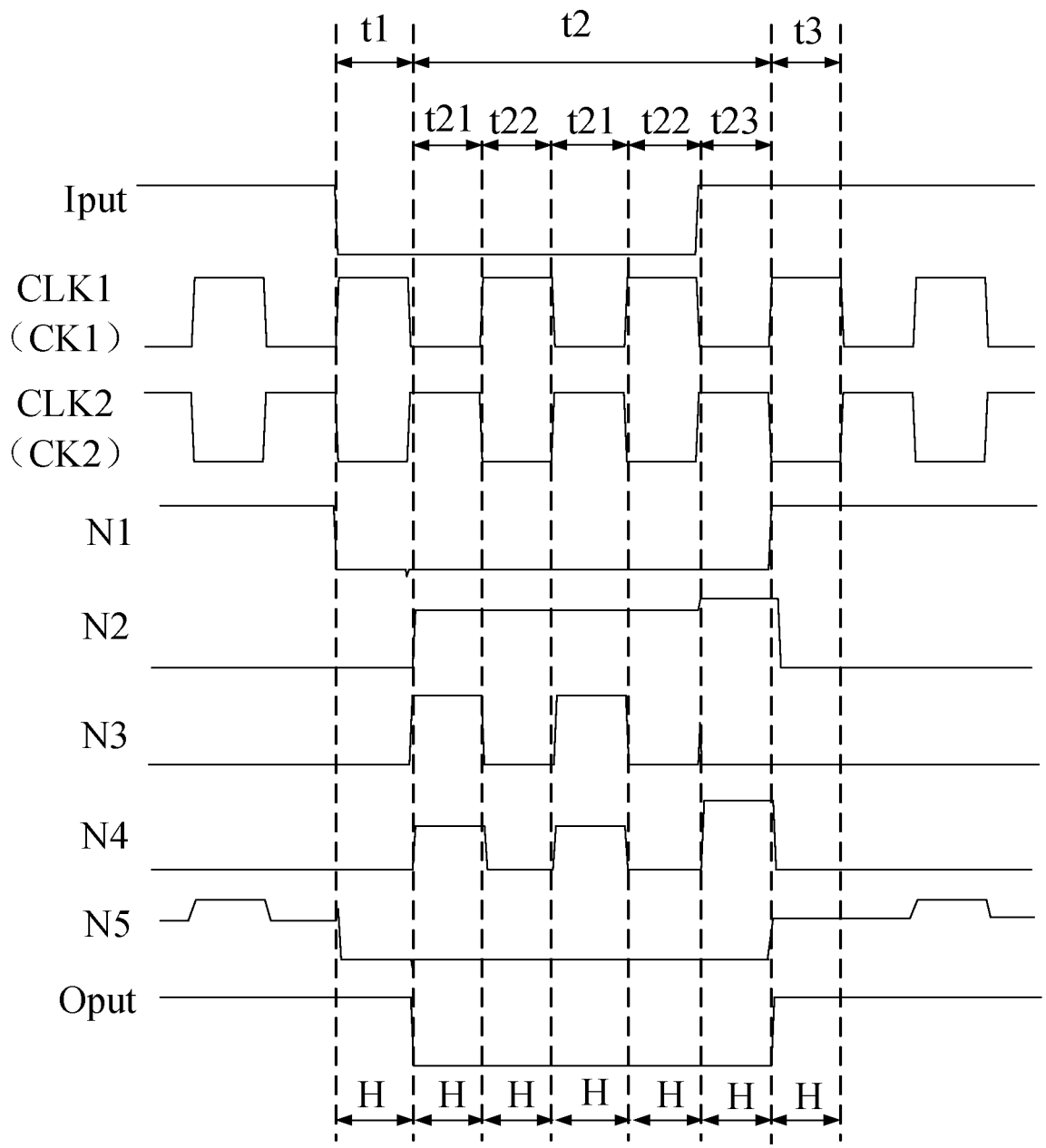
FIG. 11 is a timing diagram of a driving method of a shift register, in accordance with some embodiments.

In some embodiments, as shown in FIG. 11, the duration of the effective potential of the input signal provided by the input signal terminal Iput is equal to the duration of the effective potential of the scan signal output by the scan signal terminal Oput.

For example, the scan signal may be a signal that has a same waveform as the input signal and has a phase delay relative to the input signal.

With continued reference to FIG. 9, the structure of the shift register provided in some embodiments of the present disclosure will be integrally and exemplarily introduced below.

The shift register includes the input circuit 110, the first output circuit 120, the first control circuit 130, the second control circuit 140, and the second output circuit 150.

The input circuit 110 includes the seventh transistor T7 and the eighth transistor T8. The first output circuit 120 includes the ninth transistor T9 and the third capacitor C3. The first control circuit 130 includes the first transistor T1, the second transistor T2, the third transistor T3, the fourth transistor T4, the fifth transistor T5, the first capacitor C1 and the second capacitor C2. The second control circuit 140 includes the sixth transistor T6. The second output circuit 150 includes the tenth transistor T10 and the fourth capacitor C4.

The control electrode of the first transistor T1 is coupled to the input signal terminal Iput, the first electrode of the first transistor T1 is coupled to the first voltage signal terminal VGL, and the second electrode of the first transistor T1 is coupled to the third node N3. The first transistor T1 is configured to transmit the first voltage signal provided by the first voltage signal terminal VGL to the third node N3 under the control of the input signal provided by the input signal terminal Iput.

The control electrode of the second transistor T2 is coupled to the third node N3, the first electrode of the second transistor T2 is coupled to the second clock signal terminal CLK2, and the second electrode of the second transistor T2 is coupled to the fourth node N4. The second transistor T2 is configured to transmit the second clock signal provided by the second clock signal terminal CLK2 to the fourth node N4 under the control of the potential at the third node N3.

The control electrode of the third transistor T3 is coupled to the third node N3, the first electrode of the third transistor T3 is coupled to the second voltage signal terminal VGH, and the second electrode of the third transistor T3 is coupled to the fourth node N4. The third transistor T3 is configured to transmit the second voltage signal provided by the second voltage signal terminal VGH to the fourth node N4 under the control of the potential at the third node N3.

The control electrode of the fourth transistor T4 is coupled to the first clock signal terminal CLK1, the first electrode of the fourth transistor T4 is coupled to the fourth output signal terminal SH4 (e.g., the first voltage signal terminal VGL), and the second electrode of the fourth transistor T4 is coupled to the fourth node N4. The fourth transistor T4 is configured to transmit the fourth output signal provided by the fourth output signal terminal SH4 (e.g., the first voltage signal provided by the first voltage signal terminal VGL) to the fourth node N4 under the control of the first clock signal provided by the first clock signal terminal CLK1.

The control electrode of the fifth transistor T5 is coupled to the fourth node N4, the first electrode of the fifth transistor T5 is coupled to the third output signal terminal SH3 (e.g., the second voltage signal terminal VGH), and the second electrode of the fifth transistor T5 is coupled to the second node N2. The fifth transistor T5 is configured to transmit the third output signal provided by the third output signal terminal SH3 (e.g., the second voltage signal provided by the second voltage signal terminal VGH) to the second node N2 under the control of the potential at the fourth node N4.

The control electrode of the sixth transistor T6 is coupled to the first node N1, the first electrode of the sixth transistor T6 is coupled to the first voltage signal terminal VGL, and the second electrode of the sixth transistor T6 is coupled to the second node N2. The sixth transistor T6 is configured to transmit the first voltage signal provided by the first voltage signal terminal VGL to the second node N2 under the control of the potential at the first node N1.

The control electrode of the seventh transistor T7 is coupled to the first clock signal terminal CLK1, the first electrode of the seventh transistor T7 is coupled to the input signal terminal Iput, and the second electrode of the seventh transistor T7 is coupled to the fifth node N5. The seventh transistor T7 is configured to transmit the input signal provided by the input signal terminal Iput to the fifth node N5 under the control of the first clock signal provided by the first clock signal terminal CLK1.

The control electrode of the eighth transistor T8 is coupled to the second voltage signal terminal VGH, the first electrode of the eighth transistor T8 is coupled to the fifth node N5, and the second electrode of the eighth transistor T8 is coupled to the first node N1. The eighth transistor T8 is configured to form the path between the first node N1 and the fifth node N5 under the control of the second voltage signal provided by the second voltage signal terminal VGH.

The control electrode of the ninth transistor T9 is coupled to the first node N1, the first electrode of the ninth transistor T9 is coupled to the first output signal terminal SH1 (e.g., the second voltage signal terminal VGH), and the second electrode of the ninth transistor T9 is coupled to the scan signal terminal Oput. The ninth transistor T9 is configured to transmit the first output signal provided by the first output signal terminal SH1 (e.g., the second voltage signal provided by the second voltage signal terminal VGH) to the scan signal terminal Oput under the control of the potential at the first node N1.

The control electrode of the tenth transistor T10 is coupled to the second node N2, the first electrode of the tenth transistor T10 is coupled to the second output signal terminal SH2 (e.g., the first voltage signal terminal VGL), and the second electrode of the tenth transistor T10 is coupled to the scan signal terminal Oput. The tenth transistor T10 is configured to transmit the second output signal provided by the second output signal terminal SH2 (e.g., the first voltage signal provided by the first voltage signal terminal VGL) to the scan signal terminal Oput under the control of the potential at the second node N2.

The first electrode plate of the first capacitor C1 is coupled to the second clock signal terminal CLK2, and the second electrode plate of the first capacitor C1 is coupled to the third node N3. The first capacitor C1 is configured to raise or lower the potential at the third node N3 under the control of the second clock signal provided by the second clock signal terminal CLK2.

The first electrode plate of the second capacitor C2 is coupled to the control signal terminal KZ (e.g., the input signal terminal Iput), and the second electrode plate of the second capacitor C2 is coupled to the fourth node N4. The second capacitor C2 is configured to raise or lower the potential at the fourth node N4 under the control of the control signal provided by the control signal terminal KZ (e.g., the input signal provided by the input signal terminal Iput).

The first electrode plate of the third capacitor C3 is coupled to the scan signal terminal Oput, and the second electrode plate of the third capacitor C3 is coupled to the first node N1. The third capacitor C3 is configured to maintain the stability of the potential at the first node N1 in the case where the potential of the scan signal terminal Oput changes.

The first electrode plate of the fourth capacitor C4 is coupled to the second output signal terminal SH2, and the second electrode plate of the fourth capacitor C4 is coupled to the second node N2. The fourth capacitor C4 is configured to maintain the stability of the potential at the second node N2 in the case where the potential of the scan signal terminal Oput changes.

Figure 10:
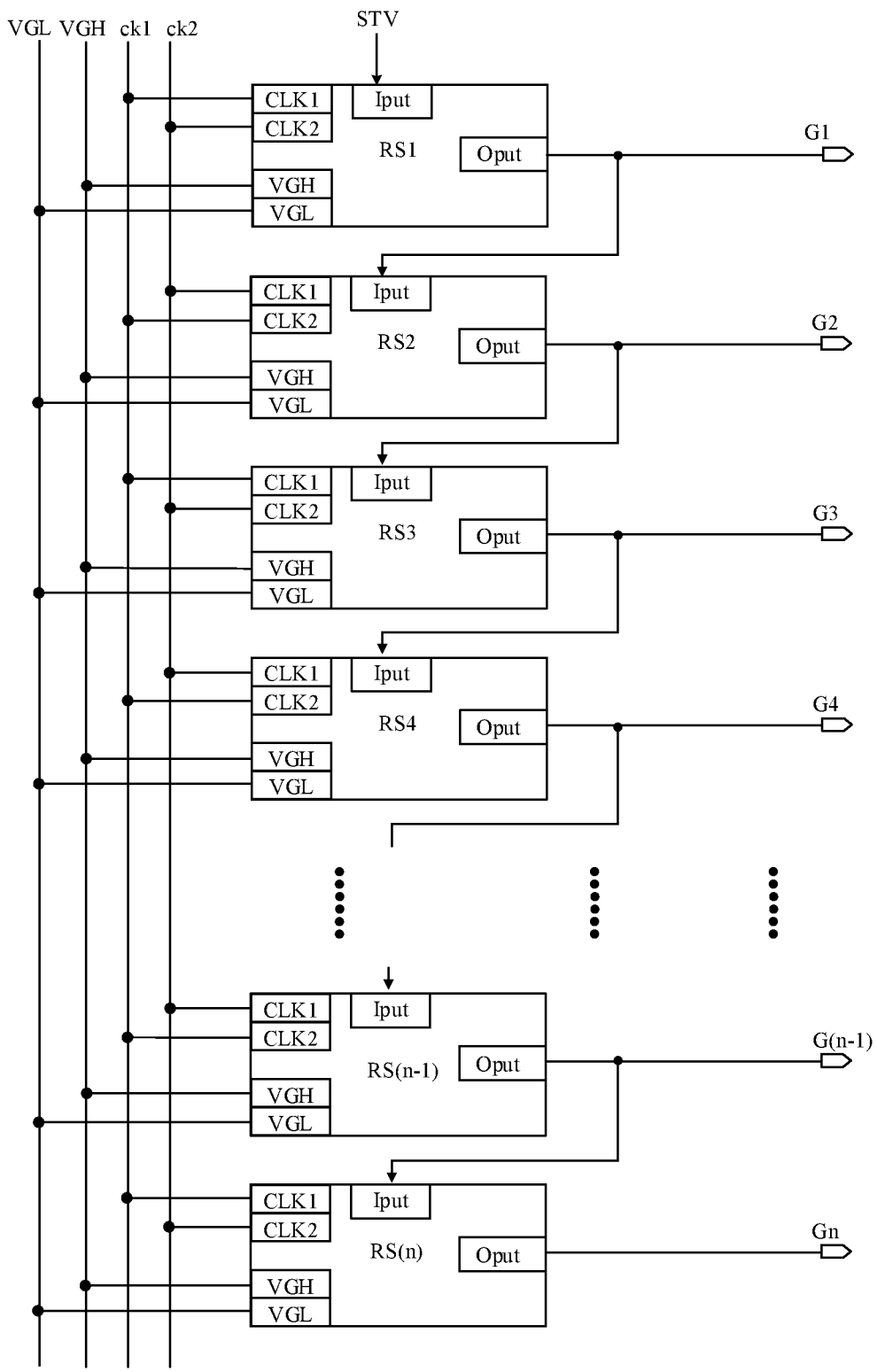
FIG. 10 is a structural diagram of a scan driving circuit, in accordance with some embodiments.

As for the scan driving circuit 01 shown in FIG. 10 constituted by the shift registers that are cascaded, in some embodiments, as shown in FIG. 10, a cascaded manner of the N shift registers in the scan driving circuit 01 is as follows.

The input signal terminal Iput of the first shift register RS1 is coupled to the frame start signal terminal STV.

The input signal terminal Iput of the i-th shift register RSi is coupled to a scan signal terminal Oput of an (i−1)-th shift register RS(i−1), where i is greater than or equal to 2 and less than or equal to N (i.e., 2≤ i≤ N), and i is a positive integer variable.

In some embodiments, as shown in FIG. 10, in the scan driving circuit 01:

first clock signal terminals CLK1 of odd-numbered shift registers (RS1, RS3, RS5, . . . ) are coupled to a first system clock signal terminal CK1, and second clock signal terminals CLK2 of the odd-numbered shift registers are coupled to a second system clock signal terminal CK2; and first clock signal terminals CLK1 of even-numbered shift registers (RS2, RS4, RS6, . . . ) are coupled to the second system clock signal terminal CK2, and second clock signal terminals CLK2 of the even-numbered shift registers are coupled to the first system clock signal terminal CK1.

Some embodiments of the present disclosure provide the driving method of the shift register, and a display process of the display apparatus is firstly introduced before the driving method is introduced.

In the field of display technologies, for example, for a liquid crystal display apparatus, a frame of image refers to an image "drawn" in a display screen in the row-by-row scanning manner or an interlaced scanning manner. For example, as shown in FIG. 2, the plurality of sub-pixels P included in the display panel PNL are arranged in an array that include N rows and M columns. In the display process, scan signals are input to sub-pixels P in a first row to sub-pixels P in an N-th row in the row-by-row manner respectively by a first gate line G1 to an N-th gate line Gn, so as to enable the sub-pixels P to be turned on row by row. When sub-pixels P in each row are turned on, data lines DL output respective data signals to all the sub-pixels in the current row of sub-pixels P (including M sub-pixels in total), so that the plurality of sub-pixels P are lit up from the first row to the N-th row to display a corresponding image. In this way, the frame of image may be "drawn" or displayed. Next, the plurality of sub-pixels P are lit up from the first row to the N-th row in the row-by-row scanning manner again, so that another corresponding image is displayed. In this way, a next frame of image may be "drawn" or displayed.

Generally, a refresh frequency of the display apparatus may be 60 HZ or 100 HZ. That is, the display apparatus may display 60 frames of images or 100 frames of images in one second, and the display period of each frame of image is 1/60 seconds or 1/100 seconds. Since human eyes have persistence of vision, there may be a case that the human eyes do not feel any change of an image in the display apparatus within one second when a still image is displayed, but actually the image in the display apparatus has been repeatedly displayed 60 or 100 times. When the refresh frequency of the display apparatus is high enough, the human eyes will not feel flickering caused by image switching.

That is, the display process of the display apparatus includes a plurality of frame periods, and N rows of sub-pixels P are scanned in each frame period, so that the frame of image is displayed. For the scan driving circuit, in each frame period, the scan signals are sequentially output by the N shift registers included in the scan driving circuit, that is, the scan signals are sequentially output from the first shift register to the N-th shift register. As a result, the row-by-row scanning of the gate lines is achieved.

Based on this, in combination with FIGS. 6, 8, 9, and 11, in some embodiments, the driving process of the shift register within a preset duration includes an input phase t1, an output phase t2 and a reset phase t3. The preset duration may be a single frame period or a plurality of frame periods, which is not limited here.

As shown in FIG. 11, in the input phase t1, the following process will be included.

The input signal provided by the input signal terminal Iput is a low-potential signal, the first clock signal provided by the first clock signal terminal CLK1 is a high-potential signal, the second clock signal provided by the second clock signal terminal CLK2 is a low-potential signal, the first voltage signal terminal VGL provides a low-potential signal, and the second voltage signal terminal VGH provides a high-potential signal.

The input circuit 110 is turned on at least under the control of the high-potential first clock signal provided by the first clock signal terminal CLK1, so as to transmit the low-potential input signal received from the input signal terminal Iput to the first node N1.

For example, as shown in FIG. 8, the input circuit 110 is turned on under the control of the high-potential first clock signal provided by the first clock signal terminal CLK1, so as to transmit the low-potential input signal received from the input signal terminal Iput to the first node N1.

For example, as shown in FIG. 9, the input circuit 110 is turned on under the control of the high-potential first clock signal provided by the first clock signal terminal CLK1 and the high-potential second voltage signal provided by the second voltage signal terminal VGH, so as to transmit the low-potential input signal received from the input signal terminal Iput to the first node N1.

The first output circuit 120 is turned off under the control of the low potential at the first node N1. That is, the path between the scan signal terminal Oput and the first output signal terminal SH1 (e.g., the second voltage signal terminal VGH) is disconnected. In the input phase t1, a potential of the scan signal terminal Oput remains a high potential as that in a previous phase.

The first control circuit 130 is turned off under the control of the low-potential input signal provided by the input signal terminal Iput and the high-potential first clock signal provided by the first clock signal terminal CLK1. That is, a path between the third output signal terminal SH3 (e.g., the second voltage signal terminal VGH or the second clock signal terminal CLK2) and the second node is disconnected.

The second control circuit 140 is turned off under the control of the low potential at the first node N1. That is, a path between the first voltage signal terminal and the second node is disconnected. In the input phase t1, a potential at the second node N2 remains a low potential as that in the previous phase.

The second output circuit 150 is turned off under the control of the low potential at the second node N2. That is, a path between the second output signal terminal SH2 (e.g., the first voltage signal terminal VGL) and the scan signal terminal Oput is disconnected.

For example, referring to FIG. 9, in the input phase t1, the seventh transistor T7 is turned on under the control of the high-potential first clock signal provided by the first clock signal terminal CLK1, and the eighth transistor T8 is turned on under the control of the high-potential signal provided by the second voltage signal terminal VGH, so that the seventh transistor T7 and the eighth transistor T8 transmit the low-potential signal received from the input signal terminal Iput to the first node N1.

The ninth transistor T9 is turned off under the control of the low potential at the first node N1, and the potential of the scan signal terminal Oput remains the high potential as that in the previous phase.

The fourth transistor T4 is turned on under the control of the high-potential first clock signal provided by the first clock signal terminal CLK1 to transmit the low-potential signal provided by the fourth output signal terminal SH4 (e.g., the first voltage signal terminal VGL or the second clock signal terminal CLK2) to the fourth node N4.

The fifth transistor T5 is turned off under the control of the low potential at the fourth node N4, so that the potential at the second node N2 maintains the low potential as that in the previous phase.

The tenth transistor T10 is turned off under the control of the low potential at the second node N2.

In addition, the first transistor T1, the second transistor T2, the third transistor T3, and the sixth transistor T6 are turned off in the input phase t1.

As shown in FIG. 11, in the output phase t2, the following process will be included.

The input circuit 110 may be turned on and off multiple times. The input circuit 110 is turned off under the control of the low-potential first clock signal provided by the first clock signal terminal CLK1, and the potential at the first node N1 remains the low potential as that in the input phase t1. The input circuit 110 is turned on under the control of the high-potential first clock signal provided by the first clock signal terminal CLK1, so as to transmit the low-potential input signal received from the input signal terminal Iput to the first node N1. That is, the potential at the first node N1 always remains the low potential in the output phase t2.

The first output circuit 120 is turned off under the control of the potential at the first node N1.

The first control circuit 130 may be turned on and off multiple times during the output phase t2. Firstly, the first control circuit 130 is turned on under the control of the high-potential second clock signal provided by the second clock signal terminal CLK2 and the high-potential signal provided by the second voltage signal terminal VGH, so as to transmit the high-potential signal provided by the third output signal terminal SH3 (e.g., the second voltage signal terminal VGH or the second clock signal terminal CLK2) to the second node N2. Then, the first control circuit 130 is turned off under the control of the high-potential first clock signal provided by the first clock signal terminal CLK1, so that the potential at the second node N2 remains the high potential which the first control circuit 130 was previously at when it was turned on. Finally, the first control circuit 130 is turned on under the control of the high-potential control signal provided by the control signal terminal KZ (e.g., the input signal terminal Iput or the second clock signal terminal CLK2), so as to transmit the high-potential signal provided by the third output signal terminal SH3 (e.g., the second voltage signal terminal VGH or the second clock signal terminal CLK2) to the second node N2.

The second control circuit 140 is turned off under the control of the low potential at the first node N1.

In combination with the operation description of the first control circuit 130 and the second control circuit 140 in the output phase t2, it can be seen that the potential at the second node N2 always remains the high potential in the output phase t2.

The second output circuit 150 is turned on under the control of the high potential at the second node N2, so as to transmit a low-potential signal received from the second output signal terminal SH2 (e.g., the first voltage signal terminal VGL) to the scan signal terminal Oput. The potential of the scan signal terminal Oput remains a low potential in the output phase t2.

As shown in FIG. 11, in the reset phase t3, the following process will be included.

The input signal provided by the input signal terminal Iput is a high-potential signal, the first clock signal provided by the first clock signal terminal CLK1 is the high-potential signal, the second clock signal provided by the second clock signal terminal CLK2 is the low-potential signal, the first voltage signal terminal VGL provides the low-potential signal, and the second voltage signal terminal VGH provides the high-potential signal.

The input circuit 110 is turned on at least under the control of the high-potential first clock signal provided by the first clock signal terminal CLK1, so as to transmit the high-potential input signal received from the input signal terminal Iput to the first node N1.

The first output circuit 120 is turned on under the control of the high potential at the first node N1, so as to transmit the high-potential signal provided by the first output signal terminal SH1 (e.g., the second voltage signal terminal VGH) to the scan signal terminal Oput. The potential of the scan signal terminal Oput in the reset phase t3 is a high potential.

The first control circuit 130 is turned off under the control of the high-potential first clock signal provided by the first clock signal terminal CLK1.

The second control circuit 140 is turned on under the control of the high potential at the first node N1, so as to transmit the low-potential first voltage signal provided by the first voltage signal terminal VGL to the second node N2.

The second output circuit 150 is turned off under the control of the low potential at the second node N2.

For example, as shown in FIG. 9, in the reset phase t3: the seventh transistor T7 is turned on under the control of the high-potential first clock signal provided by the first clock signal terminal CLK1, and the eighth transistor T8 is turned on under the control of the high-potential signal provided by the second voltage signal terminal VGH, so that the seventh transistor T7 and the eighth transistor T8 transmit the high-potential signal received from the input signal terminal Iput to the first node N1.

The ninth transistor T9 is turned on under the control of the high potential at the first node N1, so as to transmit the high-potential signal provided by the first output signal terminal SH1 (e.g., the second voltage signal terminal VGH) to the scan signal terminal Oput. The potential of the scan signal terminal Oput in the reset phase t3 is the high potential.

The first transistor T1 is turned on under the control of the high-potential input signal provided by the input signal terminal Iput, so as to transmit the low-potential signal received from the first voltage signal terminal VGL to the third node N3.

The fourth transistor T4 is turned on under the control of the high-potential first clock signal provided by the first clock signal terminal CLK1, so as to transmit the low-potential signal provided by the fourth output signal terminal SH4 (e.g., the first voltage signal terminal VGL or the second clock signal terminal CLK2) to the fourth node N4.

The fifth transistor T5 is turned off under the control of the low potential at the fourth node N4.

The sixth transistor T6 is turned on under the control of the high potential at the first node N1, so as to transmit the low-potential signal provided by the first voltage signal terminal VGL to the second node N2.

The tenth transistor T10 is turned off under the control of the low potential at the second node N2.

In addition, the second transistor T2 and the third transistor T3 are turned off in the reset phase.

As shown in FIG. 11, in some embodiments, the output phase t2 may include first output sub-phases t21, second output sub-phases t22, and a third output sub-phase t23.

As shown in FIG. 11, in the first output sub-phase t21, the following process will be included.

The input signal provided by the input signal terminal Iput is the low-potential signal, the first clock signal provided by the first clock signal terminal CLK1 is the low-potential signal, the second clock signal provided by the second clock signal terminal CLK2 is the high-potential signal, the first voltage signal terminal VGL provides the low-potential signal, and the second voltage signal terminal VGH provides the high-potential signal.

The input circuit 110 is turned off under the control of the low-potential signal provided by the first clock signal terminal CLK1, and the potential at the first node N1 remains the low potential in the input phase t1.

The first output circuit 120 is turned off under the control of the low-potential at first node N1.

The first control circuit 130 is turned on under the control of the high-potential signal provided by the second clock signal terminal CLK2 and the high-potential signal provided by the second voltage signal terminal VGH, so as to transmit the high-potential signal provided by the third output signal terminal SH3 (e.g., the second voltage signal terminal VGH or the second clock signal terminal CLK2) to the second node N2.

The second control circuit 140 is turned off under the control of the low potential at the first node N1.

The second output circuit 150 is turned on under the control of the high potential at the second node N2, so as to transmit the low-potential signal received from the second output signal terminal SH2 (e.g., the first voltage signal terminal VGL) to the scan signal terminal Oput. In the first output sub-phase t21, the potential of the scan signal terminal Oput is the low potential.

For example, referring to FIG. 9, in the first output sub-phase t21, the seventh transistor T7 is turned off under the control of the low-potential first clock signal provided by the first clock signal terminal CLK1, and the potential at the first node N1 remains the low potential in the input phase t1.

The ninth transistor T9 is turned off under the control of the low potential at the first node N1.

When the potential of the second clock signal provided by the second clock signal terminal CLK2 is raised, the potential at the third node N3 is raised through the bootstrap effect of the first capacitor C1, so that the potential at the third node N3 is a high potential.

The third transistor T3 is turned on under the control of the high potential at the third node N3, so as to transmit the high-potential signal received from the second voltage signal terminal VGH to the fourth node N4.

The fifth transistor T5 is turned on under the control of the high potential at the fourth node N4, so as to transmit the high-potential signal received from the third output signal terminal SH3 (e.g., the second voltage signal terminal VGH or the second clock signal terminal CLK2) to the second node N2.

The tenth transistor T10 is turned on under the control of the high potential at the second node N2, so as to transmit the low-potential signal received from the second output signal terminal SH2 (e.g., the first voltage signal terminal VGL) to the scan signal terminal Oput. The potential of the scan signal terminal Oput is the low potential in the first output sub-phase t21.

In addition, the first transistor T1, the fourth transistor T4 and the sixth transistor T6 are turned off in the first output sub-phase t21.

As shown in FIG. 11, in the second output sub-phase t22, the following process will be included.

The input signal provided by the input signal terminal Iput is a low-potential signal, the first clock signal provided by the first clock signal terminal CLK1 is a high-potential signal, the second clock signal provided by the second clock signal terminal CLK2 is a low-potential signal, the first voltage signal terminal VGL provides the low-potential signal, and the second voltage signal terminal VGH provides the high-potential signal.

The input circuit 110 is turned on under the control of the high-potential first clock signal provided by the first clock signal terminal CLK1, so as to transmit the low-potential input signal received from the input signal terminal Iput to the first node N1.

The first output circuit 120 is turned off under the control of the low potential at the first node N1.

The first control circuit 130 is turned off under the control of the high-potential first clock signal provided by the first clock signal terminal CLK1, and the potential at the second node N2 remains the high potential as that in the first output sub-phase t21.

The second control circuit 140 is turned off under the control of the low potential at the first node N1.

The second output circuit 150 is turned on under the control of the high potential at the second node N2, so as to transmit the low-potential signal received from the second output signal terminal SH2 (e.g., the first voltage signal terminal VGL) to the scan signal terminal Oput. The potential of the scan signal terminal Oput is the low potential in the second output sub-phase t22.

For example, as shown in FIG. 9, in the second output sub-circuit t22: the seventh transistor T7 is turned on under the control of the high-potential first clock signal provided by the first clock signal terminal CLK1, and the eighth transistor T8 is turned on under the control of the high-potential second voltage signal provided by the second voltage signal terminal VGH, so that the seventh transistor T7 and the eighth transistor T8 transmit the low-potential input signal received from the input signal terminal Iput to the first node N1.

The ninth transistor T9 is turned off under the control of the low potential at the first node N1.

The fourth transistor T4 is turned on under the control of the high-potential first clock signal provided by the first clock signal terminal CLK1, so as to transmit the low-potential signal received from the fourth output signal terminal SH4 (e.g., the first voltage signal terminal VGL or the second clock signal terminal CLK2) to the fourth node N4.

The fifth transistor T5 is turned off under the control of the low potential at the fourth node N4, so that the potential at the second node N2 remains the high potential as that in the first output sub-phase t21.

The tenth transistor T10 is turned on under the control of the high potential at the second node N2, so as to transmit the low-potential signal received from the second output signal terminal SH2 (e.g., the first voltage signal terminal VGL) to the scan signal terminal Oput. In the second output sub-phase t22, the potential of the scan signal terminal Oput is the low potential.

In addition, the first transistor T1, the second transistor T2, the third transistor T3, and the sixth transistor T6 are turned off in the second output sub-phase t22.

As shown in FIG. 11, in the third output sub-phase t23, the following process will be included.

The input signal provided by the input signal terminal Iput is a high-potential signal, the first clock signal provided by the first clock signal terminal CLK1 is a low-potential signal, the second clock signal provided by the second clock signal terminal CLK2 is a high-potential signal, the first voltage signal terminal VGL provides the low-potential signal, and the second voltage signal terminal VGH provides the high-potential signal.

The input circuit 110 is turned off under the control of the low-potential first clock signal provided by the first clock signal terminal CLK1, and the potential at the first node N1 remains the low potential as that in the second output sub-phase t22.

The first output circuit 120 is turned off under the control of the low potential at the first node N1.

The first control circuit 130 is turned on under the control of the high-potential signal provided by the control signal terminal KZ (e.g., the input signal terminal Iput or the second clock signal terminal CLK2), so as to transmit the high-potential signal received from the third output signal terminal SH3 (e.g., the second voltage signal terminal VGH or the second clock signal terminal CLK2) to the second node N2.

The second control circuit 140 is turned off under the control of the low potential at the first node N1.

The second output circuit 150 is turned on under the control of the high potential at the second node N2, so as to transmit the low-potential signal received from the second output signal terminal SH2 (e.g., the first voltage signal terminal VGL) to the scan signal terminal Oput. The potential of the scan signal terminal Oput is a low potential in the third output sub-phase t23.

For example, as shown in FIG. 9, in the third output sub-phase t23: the seventh transistor T7 is turned off under the control of the low-potential first clock signal provided by the first clock signal terminal CLK1, and the potential at the first node N1 remains the low potential as that in the second output sub-phase t22.

The ninth transistor T9 is turned off under the control of the low potential at the first node N1.

The first transistor T1 is turned on under the control of the high-potential input signal provided by the input signal terminal Iput, so as to transmit the low-potential first voltage signal received from the first voltage signal terminal VGL to the third node N3.

When the potential of the control signal provided by the control signal terminal KZ (e.g., the input signal terminal Iput or the second clock signal terminal CLK2) is raised, the potential at the fourth node N4 is raised through the bootstrap effect of the second capacitor C2, so that the potential at the fourth node N4 is at a high potential.

The fifth transistor T5 is turned on under the control of the high potential at the fourth node N4, so as to transmit the high-potential signal received from the third output signal terminal SH3 (e.g., the second voltage signal terminal VGH or the second clock signal terminal CLK2) to the second node N2.

The tenth transistor T10 is turned on under the control of the high potential at the second node N2, so as to transmit the low-potential signal received from the second output signal terminal SH2 (e.g., the first voltage signal terminal VGL) to the scan signal terminal Oput. The potential of the scan signal terminal Oput is a low potential in the third output sub-phase t23.

In addition, the second transistor T2, the third transistor T3, the fourth transistor T4, and the sixth transistor T6 are turned off in the third output sub-phase.

It will be noted that, although FIG. 9 is considering as an example for the description above, the operation process of each transistor in FIG. 6 or FIG. 8 is the same as the operation process of the transistor with the same name in FIG. 9, which may be referred to each other. For example, the operation process of the ninth transistor T9 in FIG. 6 and the operation process of the ninth transistor T9 in FIG. 8 are each the same as the operation process of the ninth transistor T9 in FIG. 9.

In some embodiments, the number of first output sub-phases t21 and the number of second output sub-phases t22 are each one or more, and the number of first output sub-phases t21 and the number of the second output sub-phases t22 are equal.

As shown in FIG. 11, a duration of the first clock signal or the second clock signal undergoing a high potential or a low potential is 1H, and an entire period of the first clock signal or the second clock signal is 2H. Durations of the input phase t1, the first output sub-phase t21, the second output sub-phase t22, the third output sub-phase t23, and the reset phase t3 are each 1H. A duration of the output phase t2 is greater than or equal to 3H, and is odd times of H. Similarly, the duration of the input signal at the low potential is greater than or equal to 3H, and is odd times of H.

It can be seen from FIG. 11 that the scan signal provided by the scan signal terminal Oput of the shift register RS is delayed by 1H relative to the input signal received by the shift register RS. Based on this, in combination with the description of the first output sub-phase t21 and the second output sub-phase t22, it can be known that, in a case where the input signal received by the shift register RS is a low-potential signal, the first output sub-phase t21 and the second output sub-phase t22 may be set repeatedly.

In addition, it can be seen from FIG. 11 that, the third output sub-phase t23 may be triggered only if the input signal is raised to a high-potential signal. Therefore, by prolonging a pulse width of the input signal at the low potential, it may be possible to increase the number of repeating the first output sub-phase t21 and the second output sub-phase t22 for the shift register RS, thereby increasing the pulse width of the low-potential signal output by the scan signal terminal Oput. Similarly, by shortening the pulse width of the input signal at the low potential, it may be possible to reduce the number of repeating the first output sub-phase t21 and the second output sub-phase t22 for the shift register RS, thereby reducing the pulse width of the low-potential signal output by the scan signal terminal Oput.

In summary, the pulse width of the low-potential signal output by the scan signal terminal Oput may be adjusted by adjusting the pulse width of the input signal at the low potential.

In some examples, as shown in FIG. 2, the display panel PNL includes the pulse width adjustment module 03. The pulse width adjustment module 03 may adjust the pulse width of the input signal at the low potential provided by the input signal terminal Iput, so as to adjust the number of first output sub-phases t21 and the number of second output sub-phases t22.

For example, the pulse width of the input signal at the low-potential provided by the input signal terminal Iput is prolonged, so that the numbers of the first output sub-phases t21 and the second output sub-phases t22 increase, and thus the pulse width of the low-potential signal output by the scan signal terminal Oput may be prolonged.

As another example, the pulse width of the input signal at the low-potential provided by the input signal terminal Iput is shortened, so that the numbers of the first output sub-phases t21 and the second output sub-phases t22 are reduced, and thus the pulse width of the low-potential signal output by the scan signal terminal Oput may be shortened.

The numbers of the first output sub-phases t21 and the second output sub-phases t22 may each be 1, 2, 3, 4, etc., which is not limited here. For example, the pulse width of the input signal at the low potential is adjusted to 5H, and thus the numbers of the first output sub-phases t21 and the second output sub-phases t22 are each 2. As another example, the pulse width of the input signal at the low potential is adjusted to 7H, and thus the numbers of the first output sub-phases t21 and the second output sub-phases t22 are each 3.

Figure 12A:
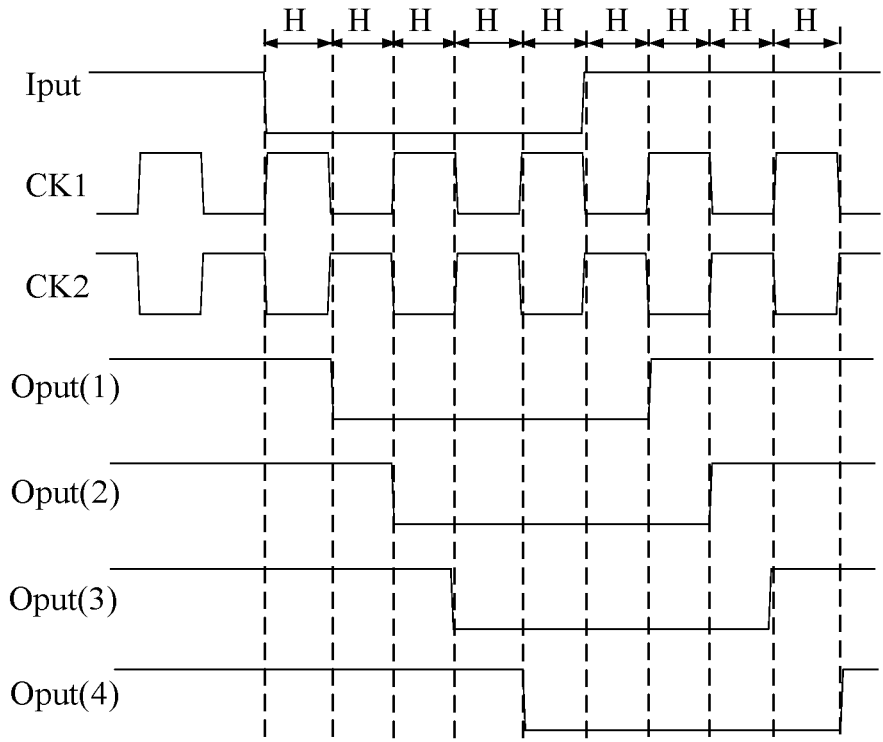
FIG. 12A is a timing diagram of a scan driving circuit, in accordance with some embodiments.

For example, in combination with FIGS. 10 and 12A, the input signal terminal Iput of the i-th shift register RSi is coupled to the scan signal terminal Oput of the (i−1)-th shift register RS(i−1). The pulse width of the input signal at the low potential is adjusted to 5H, the numbers of the first output sub-phases t21 and the second output sub-phases t22 are each 2, and the scan signal output by the scan signal terminal Oput of a succeeding shift register RS is delayed by 1H relative to the scan signal output by the scan signal terminal Oput of a preceding shift register RS.

Figure 12B:
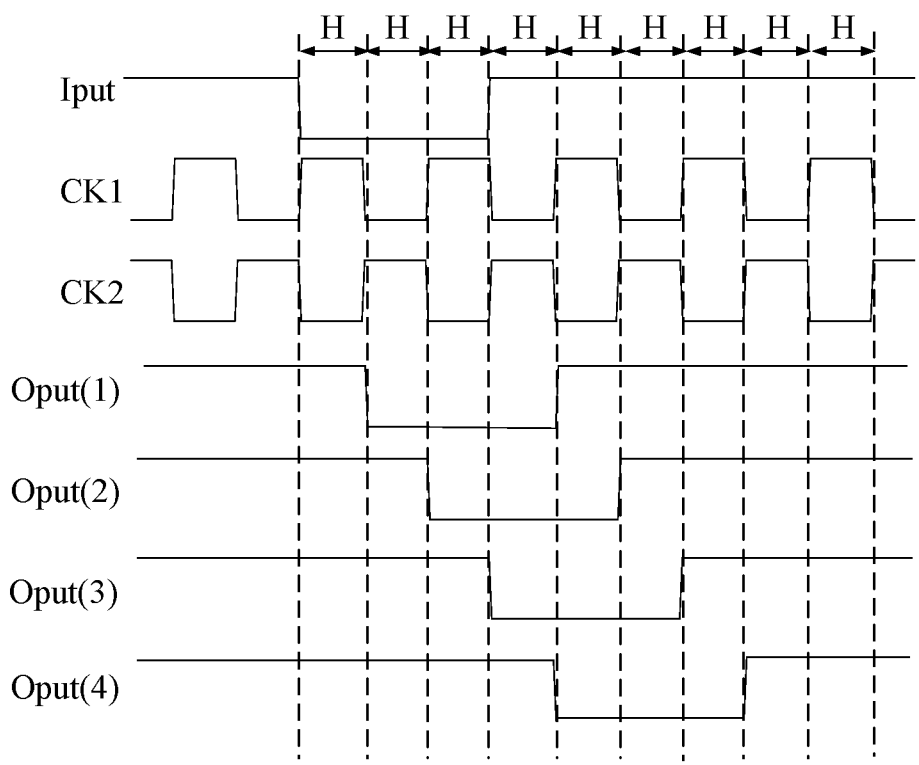
FIG. 12B is another timing diagram of a scan driving circuit, in accordance with some embodiments.

For example, in combination with FIGS. 10 and 12B, the input signal terminal Iput of the i-th shift register RSi is coupled to the scan signal terminal Oput of the (i−1)-th shift register RS(i−1). The pulse width of the input signal at the low potential is adjusted to 3H, the numbers of the first output sub-phases t21 and the second output sub-phases t22 are each 1, and the scan signal output by the scan signal terminal Oput of a succeeding shift register RS is delayed by 1H relative to the scan signal output by the scan signal terminal Oput of a preceding shift register RS.

In summary, the pulse width of the input signal at the low potential may be adjusted according to actual requirements, and thus the pulse width of the scan signal output by the scan signal terminal Oput at the low potential may be adjusted, so as to meet various light-emitting requirements of actual display panels PNL. In addition, scan signals output by scan signal terminals Oput in two adjacent shift registers RS are delayed by 1H.

Figure 13:
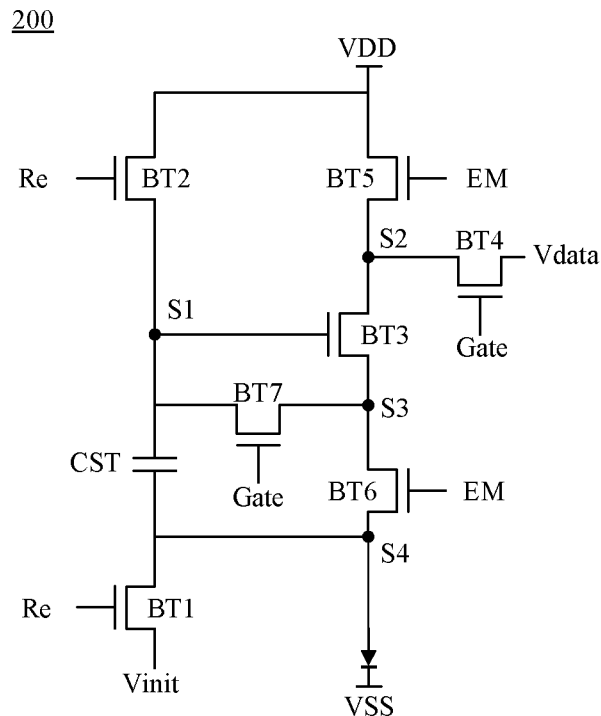
FIG. 13 is a structural diagram of a pixel circuit, in accordance with some embodiments.

As shown in FIG. 13, the embodiments of the present disclosure provide a pixel circuit 200. The pixel circuit 200 may be coupled to the shift register RS provided in the embodiments of the present disclosure. For example, the shift register RS provided in the embodiments of the present disclosure is a light-emitting control shift register, and the light-emitting control shift register is coupled to the pixel circuit 200 through a light-emitting control line.

As shown in FIG. 13, the pixel circuit 200 is a pixel circuit S in a sub-pixel P in the i-th row. The pixel circuit 200 includes an eleventh transistor BT1, a twelfth transistor BT2, a thirteenth transistor BT3, a fourteenth transistor BT4, a fifteenth transistor BT5, a sixteenth transistor BT6, a seventeenth transistor BT7, a capacitor CST, and a light-emitting device OLED.

A control electrode of the eleventh transistor BT1 is coupled to a reset signal terminal Re, a first electrode of the eleventh transistor BT1 is coupled to an initial signal terminal Vinit, and a second electrode of the eleventh transistor BT1 is coupled to a fourth node S4.

A control electrode of the twelfth transistor BT2 is coupled to the reset signal terminal Re, a first electrode of the twelfth transistor BT2 is coupled to a first power source terminal VDD, and a second electrode of the twelfth transistor BT2 is coupled to a first node S1.

A control electrode of the thirteenth transistor BT3 is coupled to the first node S1, a first electrode of the thirteenth transistor BT3 is coupled to a second node S2, and a second electrode of the thirteenth transistor BT3 is coupled to a third node S3.

A control electrode of the fourteenth transistor BT4 is coupled to a gate driving signal terminal Gate, a first electrode of the fourteenth transistor BT4 is coupled to a data signal terminal Vdata, and a second electrode of the fourteenth transistor BT4 is coupled to the second node S2.

A control electrode of the fifteenth transistor BT5 is coupled to a light-emitting control signal terminal EM, a first electrode of the fifteenth transistor BT5 is coupled to the first power source terminal VDD, and a second electrode of the fifteenth transistor BT5 is coupled to the second node S2.

A control electrode of the sixteenth transistor BT6 is coupled to the light-emitting control signal terminal EM, a first electrode of the sixteenth transistor BT6 is coupled to the third node S3, and a second electrode of the sixteenth transistor BT6 is coupled to the fourth node S4.

A control electrode of the seventeenth transistor BT7 is coupled to the gate driving signal terminal Gate, a first electrode of the seventeenth transistor BT7 is coupled to the first node S1, and a second electrode of the seventeenth transistor BT7 is coupled to the third node S3.

A first electrode plate of the capacitor CST is coupled to the fourth node S4, and a second electrode plate of the capacitor CST is coupled to the first node S1.

An anode of the light-emitting device OLED is coupled to the fourth node S4, and a cathode of the light-emitting device OLED is coupled to a second power source terminal VSS.

Figure 14:
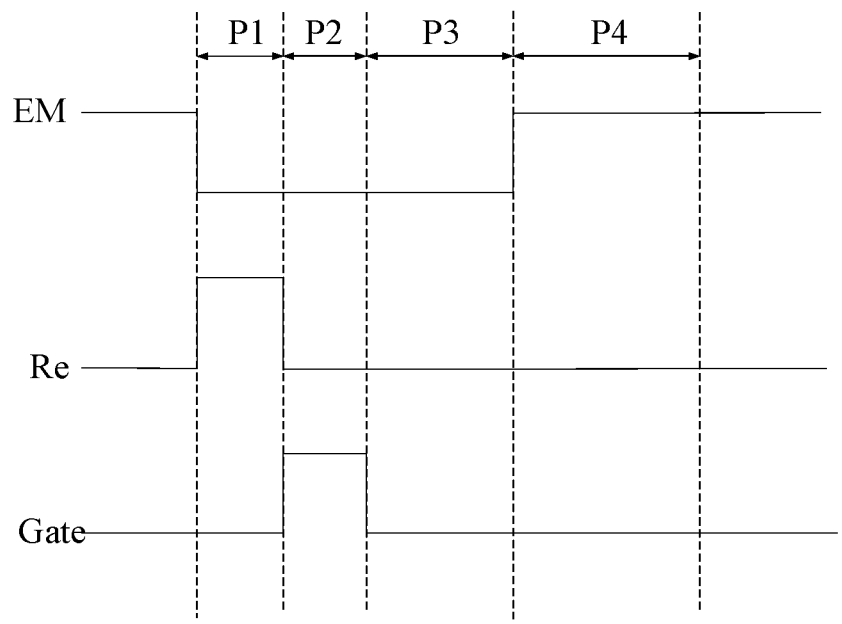
FIG. 14 is a timing diagram of a pixel circuit, in accordance with some embodiments.

As shown in FIGS. 13 and 14, a driving method of the pixel circuit may include a reset phase P1, a threshold compensation phase P2, a buffer phase P3 and a light-emitting phase P4.

In the reset phase P1, the light-emitting control signal terminal EM and the gate driving signal terminal Gate each output an invalid level (a low level), and the reset signal terminal Re outputs an effective level (a high level). The eleventh transistor BT1 and the twelfth transistor BT2 are turned on, so that a high-level signal from the first power terminal VDD is transmitted to the first node S1, and an initial signal from the initial signal terminal Vinit is transmitted to the fourth node S4.

In the threshold compensation phase P2, the light-emitting control signal terminal EM and the reset signal terminal Re each output an invalid level (a low level), and the gate driving signal terminal Gate outputs an effective level (an high level). The fourteenth transistor BT4 and the seventeenth transistor BT7 are turned on, so that the data signal terminal Vdata writes a compensation voltage (Vdata+Vth) into the first node S1.

In the buffer phase P3, the gate driving signal terminal Gate, the light-emitting control signal terminal EM and the reset signal terminal Re each output an invalid level (a low level).

In the light-emitting phase P4, the reset signal terminal Re and the gate driving signal terminal Gate each output an invalid level (a low level), and the light-emitting control signal terminal EM outputs an effective level (a high level). The fifteenth transistor BT5 and the sixteenth transistor BT6 are turned on, so that the voltage at the fourth node S4 changes from Vinit to Voled, where Vinit is a voltage of the initial signal. Due to the coupling effect of the capacitor CST, the voltage at the first node S1 becomes (Vdata+Vth+Voled−Vinit), so that a current I output from the thirteenth transistor BT3 satisfies that $I=(\mu W Cox/2 L)$ (Vdata+Vth+Voled−Vinit−Voled−Vth)$^2$=$(\mu W Cox/2 L)$ (Vdata−Vinit)$^2$.

The light-emitting control signal provided by the light-emitting control signal terminal EM is the scan signal provided by the scan signal terminal Oput of the shift register RS. It can be understood that the output phase t2 in FIG. 11 corresponds to a whole of the reset phase P1, the threshold compensation phase P2 and the buffer phase P3 in FIG. 14.

In some examples, the reset signal terminal RE(i) of the pixel circuit in the i-th row may be coupled to the gate driving signal terminal Gate(i−1) that is coupled to the sub-pixel in the (i−1)-th row. That is, the gate driving signal of the (i−1)-th row of sub-pixels serves as the reset signal of the (i−1)-th row of sub-pixels.

In summary, the shift register RS provided in the embodiments of the present disclosure can change the duration of the low-potential signal output by the scan signal terminal Oput, thereby changing the duration of a non-light-emitting phase (i.e., the whole of the reset phase P1, the threshold compensation phase P2 and the buffer phase P3) in the pixel circuit 200. Since the duration of one frame period is determined, when the duration of the non-light-emitting phase is changed, the duration of the light-emitting phase P4 is also changed. In this way, by adjusting the duration of the low-potential signal output by the scan signal terminal Oput in the shift register, the duration of the light-emitting phase P4 of the pixel circuit 200 may be adjusted, thereby improving the flexibility of light-emitting control for the sub-pixel.

It will be noted that, the transistors used in the shift register provided in the embodiments of the present disclosure may be thin film transistors, field effect transistors or other switching devices with the same characteristics, and the transistors in the embodiments of the present disclosure may be enhancement-mode transistors or depletion-mode transistors, which are not limited in the present disclosure.

In some embodiments, for each transistor used in the shift register, a control electrode thereof is a gate of the transistor, a first electrode thereof is one of a source and a drain of the transistor, and a second electrode thereof is another of the source and the drain of the transistor. Since the source and the drain of the transistor may be symmetrical in structure, the source and the drain of the transistor may be indistinguishable in structure. That is, the first electrode and the second electrode of the transistor in the embodiments of the present disclosure may be indistinguishable in structure. For example, in a case where the transistor is a P-type transistor, the first electrode of the transistor is a source, and the second electrode of the transistor is a drain. For example, in a case where the transistor is an N-type transistor, the first electrode of the transistor is the drain, and the second electrode of the transistor is the source.

In addition, the shift register provided in the embodiments of the present disclosure is described by considering an example where the transistors are all N-type transistors, however, it will be noted that, the embodiments of the present disclosure include but are not limited thereto. For example, one or more transistors in the shift register in the embodiments of the present disclosure may adopt P-type transistor(s). For the connection manner of electrodes of a selected-type transistor, reference may be made to the connection manner of electrodes of corresponding TFTs in the embodiments of the present disclosure, and corresponding voltage terminals are each enabled to provide a corresponding high-level voltage or low-level voltage.

It will also be noted that the high-potential signal and the low-potential signal that are mentioned in the embodiments of the present disclosure are relatively high and low, that is, only a potential of the high-potential signal is higher than that of the low-potential signal, and potential values of the high potential and the low potential are not limited.

The foregoing descriptions are merely specific implementation manners of the present disclosure, but the protection scope of the present disclosure is not limited thereto. Changes or replacements that any person skilled in the art could conceive of within the technical scope of the present disclosure shall all be included in the protection scope of the present disclosure. Therefore, the protection scope of the present disclosure shall be subject to the protection scope of the claims.

What is claimed is:

1. A shift register, comprising:
an input circuit coupled to an input signal terminal, a first clock signal terminal and a first node; and the input circuit being configured to transmit an input signal provided by the input signal terminal to the first node under control of a first clock signal provided by the first clock signal terminal;
a first output circuit coupled to the first node, a first output signal terminal and a scan signal terminal; and the first output circuit being configured to transmit a first output signal provided by the first output signal terminal to the scan signal terminal under control of a potential at the first node;
a first control circuit at least coupled to the input signal terminal, a first voltage signal terminal, the first clock signal terminal, a second voltage signal terminal, a second clock signal terminal, a third output signal terminal and a second node; and the first control circuit being configured to transmit a third output signal provided by the third output signal terminal to the second node at least under control of the input signal provided by the input signal terminal, a second clock signal provided by the second clock signal terminal, and the first clock signal provided by the first clock signal terminal;
a second control circuit coupled to the first node and the second node; and the second control circuit being configured to control the potential at the first node and a potential at the second node to be two inverted potentials; and
a second output circuit coupled to the second node, a second output signal terminal and the scan signal terminal; and the second output circuit being configured to transmit a second output signal provided by the second output signal terminal to the scan signal terminal under control of the potential at the second node.

2. The shift register according to claim 1, wherein the first control circuit is further coupled to a fourth output signal terminal and a control signal terminal; the first control circuit is configured to transmit the third output signal provided by the third output signal terminal to the second node under control of the input signal provided by the input signal terminal, the second clock signal provided by the second clock signal terminal, a control signal provided by the control signal terminal and the first clock signal provided by the first clock signal terminal; and the first control circuit includes:
a first node control sub-circuit coupled to the input signal terminal, the first voltage signal terminal and a third node; and the first node control sub-circuit being configured to transmit a first voltage signal provided by the first voltage signal terminal to the third node under control of the input signal provided by the input signal terminal;
a second node control sub-circuit coupled to the second clock signal terminal and the third node; and the second node control sub-circuit being configured to raise or lower a potential at the third node under control of the second clock signal provided by the second clock signal terminal;
a third node control sub-circuit coupled to the second voltage signal terminal, the control signal terminal, the fourth output signal terminal, the first clock signal terminal, the third node and a fourth node; and the third node control sub-circuit being configured to raise or lower a potential at the fourth node under control of the potential at the third node, the first clock signal provided by the first clock signal terminal and the control signal provided by the control signal terminal; and
a fourth node control sub-circuit coupled to the fourth node, the third output signal terminal and the second node; and the fourth node control sub-circuit being configured to transmit the third output signal provided by the third output signal terminal to the second node under control of a potential at the fourth node.

3. The shift register according to claim 2, wherein the third node control sub-circuit includes:
a first node control module coupled to the third node, the second voltage signal terminal and the fourth node; and the first node control module being configured to transmit a second voltage signal provided by the second voltage signal terminal to the fourth node under control of the potential at the third node;
a second node control module coupled to the fourth node and the control signal terminal; and the second node control module being configured to raise or lower the potential at the fourth node under control of the control signal provided by the control signal terminal; and
a third node control module coupled to the fourth node, the first clock signal terminal and the fourth output signal terminal; and the third node control module being configured to transmit a fourth output signal provided by the fourth output signal terminal to the fourth node under the control of the first clock signal provided by the first clock signal terminal.

4. The shift register according to claim 3, wherein the second node control module includes a second capacitor;
the control signal terminal includes the input signal terminal; a first electrode plate of the second capacitor is coupled to the control signal terminal, and a second electrode plate of the second capacitor is coupled to the fourth node; or
the control signal terminal includes the second clock signal terminal; the first electrode plate of the second capacitor is coupled to the second clock signal terminal, and the second electrode plate of the second capacitor is coupled to the fourth node.

5. The shift register according to claim 3, wherein the first node control module includes a third transistor; a control electrode of the third transistor is coupled to the third node, a first electrode of the third transistor is coupled to the second voltage signal terminal, and a second electrode of the third transistor is coupled to the fourth node.

6. The shift register according to claim 3, wherein the third node control module includes a fourth transistor;
the fourth output signal terminal includes the first voltage signal terminal; a control electrode of the fourth transistor is coupled to the first clock signal terminal, a first electrode of the fourth transistor is coupled to the first voltage signal terminal, and a second electrode of the fourth transistor is coupled to the fourth node; or
the fourth output signal terminal includes the second clock signal terminal; the control electrode of the fourth transistor is coupled to the first clock signal terminal, the first electrode of the fourth transistor is coupled to the second clock signal terminal, and the second electrode of the fourth transistor is coupled to the fourth node.

7. The shift register according to claim 3, wherein the third node control sub-circuit further includes:
a fourth node control module coupled to the second clock signal terminal, the third node and the fourth node; and the fourth node control module being configured to transmit the second clock signal provided by the second clock signal terminal to the fourth node under the control of the potential at the third node; or
the third node control sub-circuit further includes:
the fourth node control module coupled to the second clock signal terminal, the third node and the fourth node; and the fourth node control module being configured to transmit the second clock signal provided by the second clock signal terminal to the fourth node under the control of the potential at the third node; wherein the fourth node control module includes a second transistor; a control electrode of the second transistor is coupled to the third node, a first electrode of the second transistor is coupled to the second clock signal terminal, and a second electrode of the second transistor is coupled to the fourth node.

8. The shift register according to claim 2, wherein the first node control sub-circuit includes a first transistor; a control electrode of the first transistor is coupled to the input signal terminal, a first electrode of the first transistor is coupled to the first voltage signal terminal, and a second electrode of the first transistor is coupled to the third node; and
the second node control sub-circuit includes a first capacitor; a first electrode plate of the first capacitor is coupled to the second clock signal terminal, and a second electrode plate of the first capacitor is coupled to the third node.

9. The shift register according to claim 2, wherein the fourth node control sub-circuit includes a fifth transistor;
the third output signal terminal includes the second voltage signal terminal; a control electrode of the fifth transistor is coupled to the fourth node, a first electrode of the fifth transistor is coupled to the second voltage signal terminal, and a second electrode of the fifth transistor is coupled to the second node; or
the third output signal terminal includes the second clock signal terminal; the control electrode of the fifth transistor is coupled to the fourth node, the first electrode of the fifth transistor is coupled to the second clock signal terminal, and the second electrode of the fifth transistor is coupled to the second node.

10. The shift register according to claim 1, wherein the second control circuit includes a sixth transistor;
a control electrode of the sixth transistor is coupled to the first node, a first electrode of the sixth transistor is coupled to the first voltage signal terminal, and a second electrode of the sixth transistor is coupled to the second node; and/or
the first output circuit includes:
a third capacitor, a first electrode plate of the third capacitor being coupled to the scan signal terminal, and a second electrode plate of the third capacitor being coupled to the first node; and
a ninth transistor, a control electrode of the ninth transistor being coupled to the first node, a first electrode of the ninth transistor being coupled to the first output signal terminal, and a second electrode of the ninth transistor being coupled to the scan signal terminal; and/or the second output circuit includes:
a fourth capacitor, a first electrode plate of the fourth capacitor being coupled to the second output signal terminal, and a second electrode plate of the fourth capacitor being coupled to the second node; and
a tenth transistor, a control electrode of the tenth transistor being coupled to the second node, a first electrode of the tenth transistor being coupled to the second output signal terminal, and a second electrode of the tenth transistor being coupled to the scan signal terminal.

11. The shift register according to claim 1, wherein the input circuit includes a seventh transistor;
a control electrode of the seventh transistor is coupled to the first clock signal terminal, a first electrode of the seventh transistor is coupled to the input signal terminal, and a second electrode of the seventh transistor is coupled to the first node.

12. The shift register according to claim 1, wherein the input circuit includes an input sub-circuit and a voltage stabilizing sub-circuit;
the input sub-circuit is coupled to the input signal terminal, the first clock signal terminal and a fifth node; and the input sub-circuit is configured to transmit the input signal provided by the input signal terminal to the fifth node under the control of the first clock signal provided by the first clock signal terminal; and
the voltage stabilizing sub-circuit is coupled to the first node, the fifth node and the second voltage signal terminal; and
the voltage stabilizing sub-circuit is configured to form a path between the first node and the fifth node under control of a second voltage signal provided by the second voltage signal terminal.

13. The shift register according to claim 12, wherein the input sub-circuit includes a seventh transistor, and the voltage stabilizing sub-circuit includes an eighth transistor;
a control electrode of the seventh transistor is coupled to the first clock signal terminal, a first electrode of the seventh transistor is coupled to the input signal terminal, and a second electrode of the seventh transistor is coupled to the fifth node; and
a control electrode of the eighth transistor is coupled to the second voltage signal terminal, a first electrode of the eighth transistor is coupled to the fifth node, and a second electrode of the eighth transistor is coupled to the first node.

14. The shift register according to claim 1, wherein a duration of an effective potential of the input signal is equal to a duration of an effective potential of a scan signal output by the scan signal terminal.

15. A scan driving circuit, comprising N shift registers that are cascaded each according to claim 1.

16. A display panel having an active area, the display panel comprising:
a plurality of sub-pixels located in the active area, the plurality of sub-pixels being arranged in a plurality of rows and a plurality of columns; and
the scan driving circuit according to claim 15 and a pulse width adjustment module, wherein the pulse width adjustment module is coupled to the scan driving circuit, and a scan signal terminal of the scan driving circuit is coupled to sub-pixels located in a same row.

17. A display apparatus, comprising the display panel according to claim 16.

18. A driving method of a shift register, the shift register includes:
an input circuit coupled to an input signal terminal, a first clock signal terminal and a first node; and the input circuit being configured to transmit an input signal provided by the input signal terminal to the first node under control of a first clock signal provided by the first clock signal terminal;
a first output circuit coupled to the first node, a first output signal terminal and a scan signal terminal; and the first output circuit being configured to transmit a first output signal provided by the first output signal terminal to the scan signal terminal under control of a potential at the first node;
a first control circuit at least coupled to the input signal terminal, a first voltage signal terminal, the first clock signal terminal, a second voltage signal terminal, a second clock signal terminal, a third output signal terminal and a second node; and the first control circuit being configured to transmit a third output signal provided by the third output signal terminal to the second node at least under control of the input signal provided by the input signal terminal, a second clock signal provided by the second clock signal terminal, and the first clock signal provided by the first clock signal terminal;
a second control circuit coupled to the first node and the second node; and the second control circuit being configured to control the potential at the first node and a potential at the second node to be two inverted potentials; and
a second output circuit coupled to the second node, a second output signal terminal and the scan signal terminal; and the second output circuit being configured to transmit a second output signal provided by the second output signal terminal to the scan signal terminal under control of the potential at the second node; and
a preset duration includes an input phase, an output phase and a reset phase, and the driving method includes:
in the input phase, controlling both the first output circuit and the second output circuit to be turned off, the scan signal terminal continuously outputting the first output signal;
in the output phase, transmitting, by the first control circuit, the third output signal provided by the third output signal terminal to the second node, so as to control the second output circuit to continuously output the second output signal through the scan signal terminal, wherein a duration of the output phase is equal to a duration of an effective potential of the input signal; and
in the reset phase, transmitting, by the input circuit, the input signal to the first node, so as to control the first output circuit to output the first output signal through the scan signal terminal.

19. The driving method according to claim 18, wherein the first control circuit is further coupled to a control signal terminal; the output phase includes at least one first output sub-phase, at least one second output sub-phase and a third output sub-phase;
transmitting the third output signal provided by the third output signal terminal to the second node, so as to control the second output circuit to continuously output the second output signal through the scan signal terminal, includes:
in a first output sub-circuit in the at least one first output sub-phase, transmitting, by the first control circuit, the third output signal provided by the third output signal terminal to the second node under control of the second clock signal provided by the second clock signal terminal, so as to control the second output circuit to output the second output signal through the scan signal terminal;

in a second output sub-phase in the at least one second output sub-phase, controlling the first control circuit to be turned off, the scan signal terminal remaining the second output signal output in the first output sub-phase; and in the third output sub-phase, transmitting, by the first control circuit, the third output signal provided by the third output signal terminal to the second node under control of a control signal provided by the control signal terminal, so as to control the second output circuit to output the second output signal through the scan signal terminal.

20. The driving method according to claim 19, wherein a number of the at least one first output sub-phase and a number of the at least one second output sub-phase each are one or more, and the number of the at least one first output sub-phase and the number of the at least one second output sub-phase are equal.

* * * * *